(12) United States Patent
Kawae et al.

(10) Patent No.: US 8,390,044 B2
(45) Date of Patent: Mar. 5, 2013

(54) NON-LINEAR ELEMENT, DISPLAY DEVICE INCLUDING NON-LINEAR ELEMENT, AND ELECTRONIC DEVICE INCLUDING DISPLAY DEVICE

(75) Inventors: Daisuke Kawae, Chiba (JP); Hideki Uochi, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 241 days.

(21) Appl. No.: 12/954,338

(22) Filed: Nov. 24, 2010

(65) Prior Publication Data

US 2011/0127526 A1   Jun. 2, 2011

(30) Foreign Application Priority Data

Nov. 27, 2009   (JP) ................. 2009-270800

(51) Int. Cl.
  *H01L 31/062* (2012.01)
(52) U.S. Cl. ................. 257/292; 257/E29.122
(58) Field of Classification Search ............ 257/57, 257/72, 292, 655, E29.117, E29.122
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |

(Continued)

FOREIGN PATENT DOCUMENTS

| | | |
|---|---|---|
| EP | 1 737 044 A1 | 12/2006 |
| EP | 2 073 255 A2 | 6/2009 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Quoc Hoang
(74) *Attorney, Agent, or Firm* — Fish & Richardson P.C.

(57) ABSTRACT

A non-linear element (such as a diode) which includes an oxide semiconductor and has a favorable rectification property is provided. In a transistor including an oxide semiconductor in which the hydrogen concentration is $5 \times 10^{19}/cm^3$ or lower, a work function $\phi ms$ of a source electrode in contact with the oxide semiconductor, a work function $\phi md$ of a drain electrode in contact with the oxide semiconductor, and electron affinity $\chi$ of the oxide semiconductor satisfy $\phi ms \leq \chi < \phi md$, and an area of contact between the drain electrode and the oxide semiconductor is larger than an area of contact between the source electrode and the oxide semiconductor. By electrically connecting a gate electrode and the drain electrode in the transistor, a non-linear element having a favorable rectification property can be achieved.

33 Claims, 18 Drawing Sheets

U.S. PATENT DOCUMENTS

| | | | |
|---|---|---|---|
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,566,922 B2 | 7/2009 | Deleonibus |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,786,482 B2 | 8/2010 | Yamazaki et al. |
| 7,791,072 B2 | 9/2010 | Kumomi et al. |
| 7,791,074 B2 | 9/2010 | Iwasaki |
| 7,989,815 B2 * | 8/2011 | Yamazaki et al. ............... 257/72 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0086933 A1 | 4/2006 | Iechi et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0214571 A1 | 9/2006 | Yamamoto et al. |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Covan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0159885 A1 | 6/2009 | Yamazaki et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0102313 A1 | 4/2010 | Miyairi et al. |
| 2010/0102314 A1 | 4/2010 | Miyairi et al. |
| 2010/0109002 A1 | 5/2010 | Itagaki et al. |
| 2010/0276689 A1 | 11/2010 | Iwasaki |
| 2010/0279462 A1 | 11/2010 | Iwasaki |
| 2011/0101338 A1 | 5/2011 | Yamazaki et al. |

FOREIGN PATENT DOCUMENTS

| | | |
|---|---|---|
| EP | 2 226 847 A2 | 9/2010 |
| JP | 55-006856 A | 1/1980 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-297406 A | 11/1995 |
| JP | 08-264794 A | 10/1996 |
| JP | 11-505377 A | 5/1999 |
| JP | 2000-044236 A | 2/2000 |
| JP | 2000-044236 A | 5/2000 |
| JP | 2000-133819 A | 5/2000 |
| JP | 2000-150900 A | 5/2000 |
| JP | 2000-150900 A | 3/2002 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-110110 A | 4/2003 |
| JP | 2004-103957 A | 4/2004 |
| JP | 2004-273614 A | 9/2004 |
| JP | 2004-273732 A | 9/2004 |
| JP | 2005-294571 A | 10/2005 |
| JP | 2006-165527 A | 6/2006 |
| JP | 2006-165528 A | 6/2006 |
| JP | 2006-165529 A | 6/2006 |
| JP | 2007-073705 A | 3/2007 |
| JP | 2007103918 A | 4/2007 |
| JP | 2007-531258 A | 11/2007 |
| JP | 2009-170900 A | 7/2009 |
| WO | 2004/114391 A1 | 12/2004 |
| WO | 2006/051993 A2 | 5/2006 |
| WO | 2007/029844 A1 | 3/2007 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report, PCT Application No. PCT/JP2010/069774, dated Jan. 25, 2011, 3 pages.

Written Opinion, PCT Application No. PCT/JP2010/069774, dated Jan. 25, 2011, 5 pages.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancles in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium13 Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5') Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m =3, 4, and 5), InGaO3(ZnO)3, and Ga2O3(ZnO)m (m =7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.

* cited by examiner

NON-LINEAR ELEMENT, DISPLAY DEVICE INCLUDING NON-LINEAR ELEMENT, AND ELECTRONIC DEVICE INCLUDING DISPLAY DEVICE

TECHNICAL FIELD

An embodiment of the present invention relates to a non-linear element (e.g., a diode) including an oxide semiconductor and a semiconductor device such as a display device including the non-linear element. Further, an embodiment of the present invention relates to an electronic device including the semiconductor device.

BACKGROUND ART

Among semiconductor devices, diodes are required to have high withstand voltage, small reverse saturation current, and the like. Silicon carbide (SiC) used as a semiconductor material has a width of a forbidden band of 3 eV or more, excellent controllability of electric conductivity at high temperature, and a dielectric breakdown electric field that is about an order of magnitude higher than that of silicon. Therefore, silicon carbide is expected to be applied to a diode in which reverse saturation current is small and withstand voltage is high. For example, a Schottky barrier diode in which silicon carbide is used and reverse leakage current is reduced is known (Patent Document 1).

However, in the case of using silicon carbide, it is difficult to obtain crystals with good quality, and further, there is a problem in that a process temperature for manufacturing a device is high. For example, an ion implantation method is used to form an impurity region in silicon carbide; in that case, heat treatment at 1500° C. or higher is necessary in order to activate a dopant or repair crystal defects caused by ion implantation.

In addition, since carbon is contained as a component in silicon carbide, an insulating layer with good quality cannot be formed by thermal oxidation. Furthermore, silicon carbide is chemically very stable and is not easily etched by normal wet etching.

REFERENCE

Patent Document

[Patent Document 1] Japanese Published Patent Application No. 2000-133819

DISCLOSURE OF INVENTION

As described above, although a diode in which silicon carbide is used is expected to have high withstand voltage and small reverse saturation current, there are many problems in manufacturing and achieving such a diode.

In view of the above, it is an object of an embodiment of the present invention to provide a non-linear element with high withstand voltage and a favorable rectification property. In addition, it is an object to manufacture a non-linear element with small reverse saturation current at low process temperature.

An embodiment of the present invention includes a source electrode, an oxide semiconductor layer, a drain electrode, a gate insulating layer covering the source electrode, the oxide semiconductor layer, and the drain electrode, and a plurality of gate electrodes formed in contact with the gate insulating layer, which face each other with the source electrode, the oxide semiconductor, and the drain electrode provided therebetween. The plurality of gate electrodes are connected to the drain electrode, and an area of contact between the source electrode and the oxide semiconductor layer is different from an area of contact between the drain electrode and the oxide semiconductor layer.

When the area of contact between the drain electrode and the oxide semiconductor layer is made larger than the area of contact between the source electrode and the oxide semiconductor layer, current vs. voltage characteristics particularly in forward bias can be improved.

When the area of contact between the drain electrode and the oxide semiconductor layer is made smaller than the area of contact between the source electrode and the oxide semiconductor layer, current vs. voltage characteristics particularly in reverse bias can be improved.

Another embodiment of the present invention includes a first electrode, an oxide semiconductor layer, a second electrode, a gate insulating layer covering the first electrode, the oxide semiconductor layer, and the second electrode, and a plurality of third electrodes formed in contact with the gate insulating layer, which face each other with the first electrode, the oxide semiconductor layer, and the second electrode provided therebetween. The plurality of third electrodes are connected to the first electrode or the second electrode. A work function $\phi md$ of one of the first electrode and the second electrode which is connected to the plurality of third electrodes, a work function $\phi ms$ of the other of the first electrode and the second electrode which is not connected to the plurality of third electrodes, and electron affinity $\chi$ of the oxide semiconductor layer satisfy $\phi ms \leq \chi < \phi md$. An area of contact between the first electrode and the oxide semiconductor layer is different from an area of contact between the second electrode and the oxide semiconductor layer.

When an area of contact between the oxide semiconductor layer and one of the first electrode and the second electrode which has the work function $\phi md$ is made larger than an area of contact between the oxide semiconductor layer and the other of the first electrode and the second electrode which has the work function $\phi ms$, current vs. voltage characteristics particularly in forward bias can be improved.

When the area of contact between the oxide semiconductor layer and one of the first electrode and the second electrode which has the work function $\phi md$ is made smaller than the area of contact between the oxide semiconductor layer and the other of the first electrode and the second electrode which has the work function $\phi ms$, current vs. voltage characteristics particularly in reverse bias can be improved.

Another embodiment of the present invention includes a first electrode formed over a substrate, an oxide semiconductor layer formed on and in contact with the first electrode, a second electrode formed on and in contact with the oxide semiconductor layer, a gate insulating layer covering the first electrode, the oxide semiconductor layer, and the second electrode, and a plurality of third electrodes formed in contact with the gate insulating layer, which face each other with the first electrode, the oxide semiconductor layer, and the second electrode provided therebetween. The plurality of third electrodes are connected to the first electrode. A work function $\phi md$ of the first electrode, electron affinity $\chi$ of the oxide semiconductor layer, and a work function $\phi ms$ of the second electrode satisfy $\phi ms \leq \chi < \phi md$. An area of contact between the first electrode and the oxide semiconductor layer is larger than an area of contact between the second electrode and the oxide semiconductor layer.

When the area of contact between the oxide semiconductor layer and the first electrode which has the work function $\phi md$ is made larger than the area of contact between the oxide semiconductor layer and the second electrode which has the work function φms, a rectification property of a diode which is an embodiment of a non-linear element can be improved. In particular, current vs. voltage characteristics in forward bias can be improved.

Another embodiment of the present invention includes a first electrode formed over a substrate, an oxide semiconductor layer formed on and in contact with the first electrode, a second electrode formed on and in contact with the oxide semiconductor layer, a gate insulating layer covering the first electrode, the oxide semiconductor layer, and the second electrode, and a plurality of third electrodes formed in contact with the gate insulating layer, which face each other with the first electrode, the oxide semiconductor layer, and the second electrode provided therebetween. The plurality of third electrodes are connected to the second electrode. A work function φms of the first electrode, electron affinity χ of the oxide semiconductor layer, and a work function φmd of the second electrode satisfy φms≦χ<φmd. An area of contact between the second electrode and the oxide semiconductor layer is smaller than an area of contact between the first electrode and the oxide semiconductor layer.

When the area of contact between the oxide semiconductor layer and the second electrode which has the work function φmd is made smaller than the area of contact between the oxide semiconductor layer and the first electrode which has the work function φms, a rectification property of a diode can be improved. In particular, current vs. voltage characteristics in reverse bias can be improved.

In addition, specifically, an oxide semiconductor layer in which hydrogen or an OH group is removed so that the hydrogen concentration is set to $5\times10^{19}/cm^3$ or lower, preferably $5\times10^{18}/cm^3$ or lower, more preferably $5\times10^{17}/cm^3$ or lower, or lower than $1\times10^{16}/cm^3$ and the carrier density is set to lower than $1\times10^{12}/cm^3$, preferably lower than $1\times10^{11}/cm^3$ is used.

Further, the energy gap of an oxide semiconductor is set to 2 eV or more, preferably 2.5 eV or more, more preferably 3 eV or more, and impurities such as hydrogen that forms a donor are reduced as much as possible, so that the carrier density is set to lower than $1\times10^{12}/cm^3$, preferably lower than $1\times10^{11}/cm^3$.

When the electron affinity χ of the oxide semiconductor is 4.3 eV, as a material of the electrode having a work function that is higher than the electron affinity χ of the oxide semiconductor, tungsten (W), molybdenum (Mo), chromium (Cr), iron (Fe), gold (Au), platinum (Pt), copper (Cu), cobalt (Co), nickel (Ni), beryllium (Be), indium tin oxide (ITO), or the like can be used.

In addition, when the electron affinity χ of the oxide semiconductor is 4.3 eV, as a material of the electrode having a work function that is lower than or equal to the electron affinity χ of the oxide semiconductor, titanium (Ti), yttrium (Y), aluminum (Al), zirconium (Zr), magnesium (Mg), silver (Ag), manganese (Mn), tantalum (Ta), tantalum nitride, titanium nitride, or the like can be used.

Note that in this specification, the impurity concentration is measured by secondary ion mass spectrometry (hereinafter also referred to as SIMS). However, there is no limitation particularly when descriptions of other measurement methods are made.

An embodiment of the present invention provides a non-linear element which can be miniaturized and includes a transistor that can be manufactured at low process temperature and has large on current and small off current.

An area of contact between a source electrode and an oxide semiconductor layer and an area of contact between a drain electrode and the oxide semiconductor layer are made different, whereby a non-linear element with an excellent rectification property can be obtained. In addition, a non-linear element which is resistant to an avalanche breakdown (i.e., has high withstand voltage) can be manufactured with the use of an oxide semiconductor layer.

BEST MODE FOR CARRYING OUT THE INVENTION

Figure 1A:
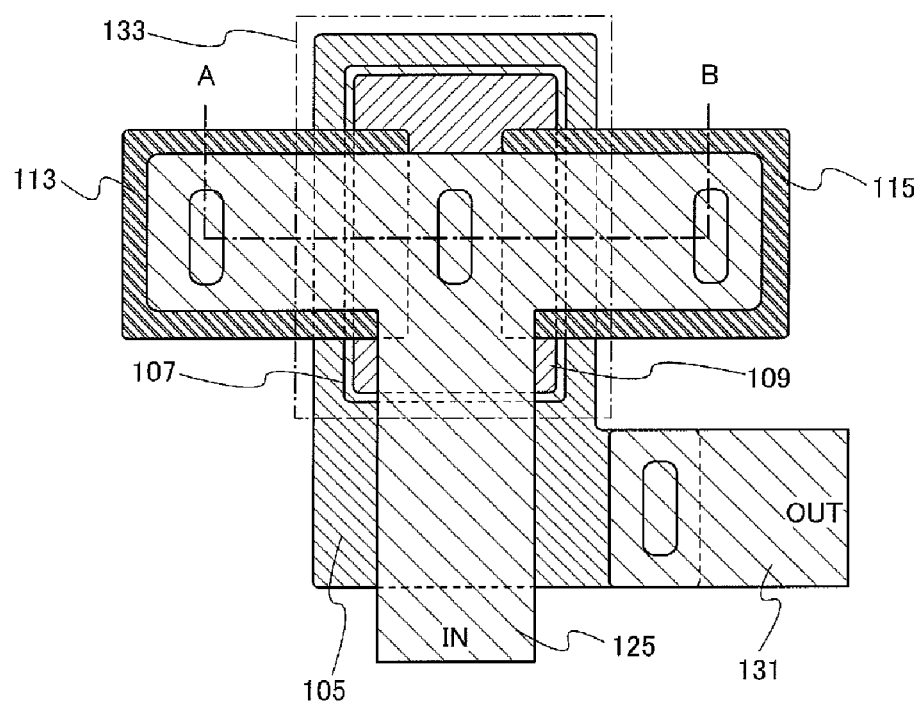
FIGS. 1A and 1B are a top view and a cross-sectional view illustrating a diode according to an embodiment of the present invention.

Embodiments of the present invention will be described in detail with reference to the accompanying drawings. Note that the present invention is not limited to the following description, and it will be easily understood by those skilled in the art that modes and details thereof can be modified in various ways without departing from the spirit and the scope of the present invention. Therefore, the present invention should not be construed as being limited to the description of the following embodiments. Note that in structures of the present invention described hereinafter, the same portions or portions having similar functions are denoted by the same reference numerals in different drawings, and description thereof is not repeated.

Note that the size, the thickness of a layer, or a region of each structure illustrated in drawings described in this specification is exaggerated for simplicity in some cases. Therefore, embodiments of the present invention are not always limited to such scales.

In addition, the terms such as "first", "second", and "third" in this specification are used in order to avoid confusion between components and do not set a limitation on number. Therefore, for example, the term "first" can be replaced with the term "second", "third", or the like as appropriate.

Note that "voltage" indicates a difference between potentials of two points, and "potential" indicates electrostatic energy (electrical potential energy) of a unit charge at a given point in an electrostatic field. However, in general, a difference between a potential of one point and a reference potential (e.g., ground potential) is merely called a potential or a voltage, and a potential and a voltage are used as synonymous words in many cases. Thus, in this specification, a potential may be rephrased as a voltage and a voltage may be rephrased as a potential unless otherwise specified.

Embodiment 1

In this embodiment, a non-linear element which uses a vertical transistor including an oxide semiconductor according to an embodiment of the present invention will be described with reference to FIGS. 1A and 1B, FIGS. 2A and 2B, FIGS. 3A and 3B, FIGS. 4A to 4C, FIGS. 5A and 5B, and FIGS. 6A to 6D. An n-type oxide semiconductor is used here. The non-linear element described in this embodiment is obtained in such a manner that a gate electrode is connected to one of a source electrode and a drain electrode in the transistor, and the transistor is made to function as a diode.

In general, a diode has two terminals, i.e., an anode and a cathode. When a potential of the anode is higher than a potential of the cathode, the diode is in a state in which current flows, that is, a conduction state. On the other hand, when the potential of the anode is lower than the potential of the cathode, the diode is in a state in which current scarcely flows, that is, a non-conduction state (insulating state).

Such a characteristic of the diode is called a rectification property. A direction in which the diode is in a conduction state is a forward direction, and a direction in which the diode is in a non-conduction state is a reverse direction. Voltage in the forward direction is forward voltage or forward bias, and current in the forward direction is forward current. In addition, voltage in the reverse direction is reverse voltage or reverse bias, and current in the reverse direction is reverse current.

Figure 1B:
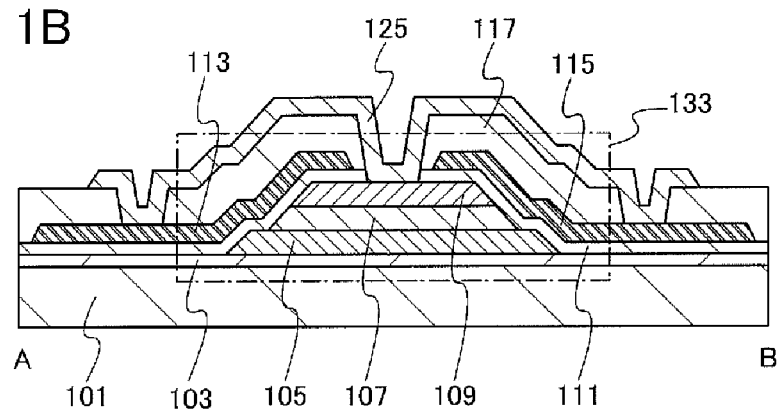

In a diode which is illustrated in FIGS. 1A and 1B and uses a vertical transistor including an oxide semiconductor, a wiring 125 is connected to a third electrode 113, a third electrode 115, and a second electrode 109. The second electrode 109 is connected to a first electrode 105 through an oxide semiconductor layer 107. The first electrode 105 is connected to a wiring 131.

FIG. 1A is a top view of a diode-connected transistor 133. FIG. 1B is a cross-sectional view along dashed-and-dotted line A-B in FIG. 1A.

As illustrated in FIG. 1B, the first electrode 105, the oxide semiconductor layer 107, and the second electrode 109 are stacked over an insulating layer 103 formed over a substrate 101. A gate insulating layer III is provided so as to cover the first electrode 105, the oxide semiconductor layer 107, and the second electrode 109. The third electrode 113 and the third electrode 115 are provided over the gate insulating layer 111. An insulating layer 117 that serves as an interlayer insulating layer is provided over the gate insulating layer 111 and the third electrodes 113 and 115.

The wiring 125 and the wiring 131 are provided over the insulating layer 117. The wiring 125 is connected to the third electrode 113 and the third electrode 115 each through an opening provided in the insulating layer 117. In addition, the wiring 125 is connected to the second electrode 109 through an opening provided in the insulating layer 117 and the gate insulating layer 111. The wiring 131 is connected to the first electrode 105 through an opening provided in the insulating layer 117 and the gate insulating layer 111. The first electrode 105 serves as one of a source electrode and a drain electrode of the transistor, and the second electrode 109 serves as the other of the source electrode and the drain electrode of the transistor. The third electrode 113 and the third electrode 115 serve as a gate electrode of the transistor.

In the transistor described in this embodiment, in a portion where the first electrode 105, the oxide semiconductor layer 107, and the second electrode 109 overlap with each other, an area of contact between the first electrode 105 and the oxide semiconductor layer 107 is larger than an area of contact between the second electrode 109 and the oxide semiconductor layer 107. In addition, in FIGS. 1A and 1B, in the portion where the first electrode 105, the oxide semiconductor layer 107, and the second electrode 109 overlap with each other, the end portions of the oxide semiconductor layer 107 are placed on the inner side than the end portions of the first electrode 105, and the end portions of the second electrode 109 are placed on the inner side than the end portions of the oxide semiconductor layer 107. When the end portion of a stack including the first electrode 105, the oxide semiconductor layer 107, and the second electrode 109 has a step-like shape as illustrated in FIGS. 1A and 1B, coverage with the gate insulating layer 111 which covers the first electrode 105, the oxide semiconductor layer 107, and the second electrode 109 can be improved. Further, the third electrode 113 and the third electrode 115 can effectively serve as the gate electrode of the vertical transistor.

In the case where the end portion of the stack has a step-like shape, the thickness of a layer corresponding to one step (the height of one step) is less than or equal to, preferably a half or less, the thickness of an upper layer which covers the layer. When the height of one step cannot be less than or equal to the thickness of the upper layer, the end portion of the layer corresponding to one step preferably has a tapered shape. In the case of employing the tapered shape, an angle between the bottom surface of the layer and the side surface of the layer is smaller than 90°, preferably smaller than 80°, more preferably smaller than 70°. In the case where the thickness of the layer corresponding to one step is set to less than or equal to the thickness of the upper layer which covers the layer, and the end portion of the layer is made to have a tapered shape, the coverage can be further improved. Note that this idea can be employed also in the case of a single layer film without limitation to the stacked film.

The transistor according to this embodiment is a vertical transistor which has features that the third electrode 113 and the third electrode 115 which serve as the gate electrode are separated and that the third electrode 113 and the third electrode 115 face each other with the first electrode 105, the oxide semiconductor layer 107, and the second electrode 109 provided therebetween.

Note that a transistor is an element having at least three terminals: a gate, a drain, and a source. The transistor has a channel formation region between a drain region and a source region, and current can flow through the drain region, the channel formation region, and the source region. Here, since the source and the drain of the transistor may be switched depending on a structure, operating conditions, and the like of the transistor, it is difficult to define which is the source or the drain. Thus, a region which serves as the source or the drain is not referred to as the source or the drain in some cases. In such a case, for example, one of the source and the drain may be referred to as a first terminal and the other thereof may be referred to as a second terminal. Alternatively, one of the source and the drain may be referred to as a first electrode and the other thereof may be referred to as a second electrode. Further alternatively, one of the source and the drain may be referred to as a first region and the other thereof may be referred to as a second region.

Further, functions of the source and the drain might be switched when a transistor having a different polarity is employed or a direction of current flow is changed in circuit operation, for example. Therefore, the terms "source" and "drain" can be switched in this specification.

It is at least necessary that the substrate 101 has enough heat resistance to heat treatment performed later. As the substrate 101, a glass substrate of barium borosilicate glass, aluminoborosilicate glass, or the like can be used.

As the glass substrate, in the case where the temperature of the heat treatment performed later is high, a glass substrate whose strain point is 730° C. or higher is preferably used. As a glass substrate, a glass material such as aluminosilicate glass, aluminoborosilicate glass, or barium borosilicate glass is used, for example. Note that by containing a larger amount of barium oxide (BaO) than that of boron oxide ($B_2O_3$), a glass substrate is heat-resistant and of more practical use. Therefore, a glass substrate containing BaO and $B_2O_3$ so that the amount of BaO is larger than that of $B_2O_3$ is preferably used.

Note that, instead of the glass substrate described above, a substrate formed using an insulator, such as a ceramic substrate, a quartz substrate, or a sapphire substrate, may be used as the substrate 101. Alternatively, crystallized glass or the like may be used.

The insulating layer 103 is formed using an oxide insulating layer such as a silicon oxide layer or a silicon oxynitride layer; or a nitride insulating layer such as a silicon nitride layer, a silicon nitride oxide layer, an aluminum nitride layer, or an aluminum nitride oxide layer. In addition, the insulating layer 103 may have a stacked structure, for example, a stacked structure in which one or more of the nitride insulating layers and one or more of the oxide insulating layers are stacked in that order over the substrate 101.

The first electrode 105 and the second electrode 109 are each formed using an element selected from aluminum (Al), chromium (Cr), iron (Fe), copper (Cu), tantalum (Ta), titanium (Ti), molybdenum (Mo), tungsten (W), and yttrium (Y); an alloy containing any of these elements as a component; an alloy containing any of these elements in combination; or the like. Alternatively, one or more materials selected from manganese (Mn), magnesium (Mg), zirconium (Zr), beryllium (Be), and thorium (Th) can be used. In addition, the first electrode 105 and the second electrode 109 can have a single-layer structure or a stacked structure having two or more layers. For example, a single-layer structure of aluminum containing silicon (Si); a two-layer structure of an aluminum layer and a titanium layer stacked thereover; a two-layer structure of a tungsten layer and a titanium layer stacked thereover; a three-layer structure in which a titanium layer, an aluminum layer, and a titanium layer are stacked in that order; and the like can be given.

Alternatively, an aluminum material obtained by adding, to aluminum (Al), an element that prevents generation of a hillock or a whisker in an aluminum layer such as titanium (Ti), tantalum (Ta), tungsten (W), molybdenum (Mo), chromium (Cr), neodymium (Nd), or scandium (Sc) may be used; in that case, heat resistance can be increased.

The first electrode 105 and the second electrode 109 may be formed using conductive metal oxide. As the conductive metal oxide, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or any of the metal oxide materials containing silicon or silicon oxide can be used.

As the oxide semiconductor layer 107, any of the following oxide semiconductor layers can be used: a four-component-based metal oxide layer such as an In—Sn—Ga—Zn—O-based layer, a three-component-based metal oxide layer such as an In—Ga—Zn—O-based layer, an In—Sn—Zn—O-based layer, an In—Al—Zn—O-based layer, a Sn—Ga—Zn—O-based layer, an Al—Ga—Zn—O-based layer, or a Sn—Al—Zn—O-based layer, a two-component-based metal oxide layer such as an In—Zn—O-based layer, a Sn—Zn—O-based layer, an Al—Zn—O-based layer, a Zn—Mg—O-based layer, a Sn—Mg—O-based layer, an In—Mg—O-based layer, or an In—Ga—O-based layer, an In—O-based layer, a Sn—O-based layer, or a Zn—O-based layer, and the like. Further, $SiO_2$ may be contained in the above oxide semiconductor layer.

In addition, as the oxide semiconductor layer 107, a thin film of a material represented by $InMO_3(ZnO)_m$, (m>0) can be used. Here, M represents one or more metal elements selected from Ga, Al, Mn, and Co. For example, M can be Ga, Ga and Al, Ga and Mn, Ga and Co, or the like. An oxide semiconductor whose composition formula is represented by $InMO_3(ZnO)_m$ (m>0), which includes Ga as M, is referred to as the In—Ga—Zn—O-based oxide semiconductor, and a thin film of the In—Ga—Zn—O-based oxide semiconductor is referred to as an In—Ga—Zn—O-based non-single-crystal film.

In the oxide semiconductor layer 107 used in this embodiment, the hydrogen concentration is $5\times10^{19}/cm^3$ or lower, preferably $5\times10^{18}/cm^3$ or lower, more preferably $5\times10^{17}/cm^3$ or lower, or lower than $1\times10^{16}/cm^3$, that is, hydrogen is removed. In other words, the oxide semiconductor layer is highly purified so that impurities that are not main components of the oxide semiconductor layer are contained as little as possible.

The carrier density can be measured by the Hall effect measurement. The carrier density of the oxide semiconductor which is measured by the Hall effect measurement is $1.45\times10^{10}/cm^3$ or lower, which is intrinsic carrier density of silicon. When calculation is performed according to Fermi-Dirac distribution law, the intrinsic carrier density of silicon is $10^{10}/cm^3$, whereas the intrinsic carrier density of an oxide semiconductor whose energy gap is 3 eV or more is $10^{-7}/cm^3$. That is, the intrinsic carrier density of the oxide semiconductor is as close to zero as possible.

The carrier density of the oxide semiconductor layer 107 which is used in this embodiment is lower than $1 \times 10^{12}/cm^3$, preferably lower than $1 \times 10^{-7}/cm^3$, which can be as close to zero as possible. With a reduction in the carrier density of the oxide semiconductor layer 107, reverse current of the non-linear element can be reduced. Further, the energy gap of the oxide semiconductor is 2 eV or more, preferably 2.5 eV or more, more preferably 3 eV or more. By using the oxide semiconductor layer with a wide energy gap, temperature characteristics can be stabilized within a practical temperature range of about room temperature to 180° C.

The thickness of the oxide semiconductor layer 107 may be 30 nm to 3000 nm inclusive. When the thickness of the oxide semiconductor layer 107 is small, forward current of the diode which is the non-linear element can be large. On the other hand, when the thickness of the oxide semiconductor layer 107 is large, typically 100 nm to 3000 nm inclusive, withstand voltage of the non-linear element can be enhanced.

The gate insulating layer 111 can be a single-layer or a stack formed using a one or more of a silicon oxide film, a silicon nitride film, a silicon oxynitride film, a silicon nitride oxide film, and an aluminum oxide film. A portion of the gate insulating layer 111 which is in contact with the oxide semiconductor layer 107 preferably contains oxygen, and in particular, the portion of the gate insulating layer 111 is preferably formed using a silicon oxide film. By using a silicon oxide film, oxygen can be supplied to the oxide semiconductor layer 107 and favorable characteristics can be obtained. The thickness of the gate insulating layer 111 may be 50 nm to 500 nm inclusive. The large thickness of the gate insulating layer 111 makes it possible to reduce leakage current flowing between the gate and the source. On the other hand, the small thickness of the gate insulating layer 111 makes it possible to manufacture a non-linear element through which a large amount of forward current can flow.

When the gate insulating layer 111 is formed using a high-k material such as hafnium silicate ($HfSi_xO_y$, (x>0, y>0)), $HfSi_xO_y$ (x>0, y>0) to which nitrogen is added, hafnium aluminate ($HfAl_xO_y$, (x>0, y>0)) to which nitrogen is added, hafnium oxide, or yttrium oxide, gate leakage current can be reduced. Further, a stacked structure can be used in which a high-k material and one or more of a silicon oxide film, a silicon nitride film, a silicon oxynitride film, a silicon nitride oxide film, and an aluminum oxide film are stacked.

The third electrode 113 and the third electrode 115 serving as the gate electrode are formed using an element selected from aluminum, chromium, copper, tantalum, titanium, molybdenum, and tungsten; an alloy containing any of these elements as a component; an alloy containing any of these elements in combination; or the like. In addition, one or more materials selected from manganese, magnesium, zirconium, and beryllium may be used. In addition, the third electrode 113 and the third electrode 115 can have a single-layer structure or a stacked structure having two or more layers. For example, a single-layer structure of aluminum containing silicon; a two-layer structure of an aluminum layer and a titanium layer stacked thereover; a three-layer structure in which a titanium layer, an aluminum layer, and a titanium layer are stacked in that order; and the like can be given. Alternatively, a film, an alloy film, or a nitride film which contains aluminum and one or more elements selected from titanium, tantalum, tungsten, molybdenum, chromium, neodymium, and scandium may be used.

The oxide semiconductor layer in this embodiment is an intrinsic (i-type) or substantially intrinsic oxide semiconductor layer obtained by removal of hydrogen, which is an n-type impurity, from the oxide semiconductor layer and an increase in purity so that an impurity other than the main components of the oxide semiconductor layer is not contained as much as possible. In other words, the oxide semiconductor layer in this embodiment is a highly purified intrinsic (i-type) oxide semiconductor layer or an oxide semiconductor layer which is close thereto obtained not by addition of an impurity but by removal of an impurity such as hydrogen, water, a hydroxyl group, or hydride as much as possible. This enables the Fermi level (Ef) to be at the same level as the intrinsic Fermi level (Ei).

By removing the impurity as much as possible as described above, for example, even when the channel width W of the transistor is $1 \times 10^4$ μm and the channel length thereof is 3 μm, off current can be $10^{-13}$ A or less, which is extremely small, and a subthreshold swing (S value) can be 0.1 V/dec. or lower.

As described above, when the oxide semiconductor layer is highly purified so that impurities that are not main components of the oxide semiconductor layer, typically hydrogen, water, a hydroxyl group, or hydride, may be contained as little as possible, favorable operation of the transistor can be obtained. In particular, when the transistor is used as a diode, reverse current can be reduced.

In a lateral transistor in which a channel is formed substantially parallel with a substrate, a source and a drain need to be provided in addition to the channel, so that an area occupied by the transistor in the substrate is increased, which hinders miniaturization. However, a source, a channel, and a drain are stacked in a vertical transistor, whereby an area occupied by the transistor at a substrate surface can be reduced. As a result of this, it is possible to miniaturize the transistor. Note that this embodiment can also be applied a lateral transistor when the transistor does not need to be miniaturized.

The channel length of a vertical transistor can be controlled by the thickness of an oxide semiconductor layer; therefore, when the oxide semiconductor layer 107 is formed to have a small thickness, the transistor can have a short channel length. When the channel length is short, series resistance of a source, a channel, and a drain can be reduced; therefore, on current and field-effect mobility of the transistor can be increased. In addition, a transistor having a highly purified oxide semiconductor layer whose hydrogen concentration is reduced is in an insulating state where off current is extremely small and almost no current flows in an off state. By connecting a source or a drain of such a transistor to a gate thereof, a diode in which forward current is large and reverse current is small can be manufactured. Therefore, a diode which is resistant to an avalanche breakdown (i.e., has high withstand voltage) can be manufactured.

Figure 17A:
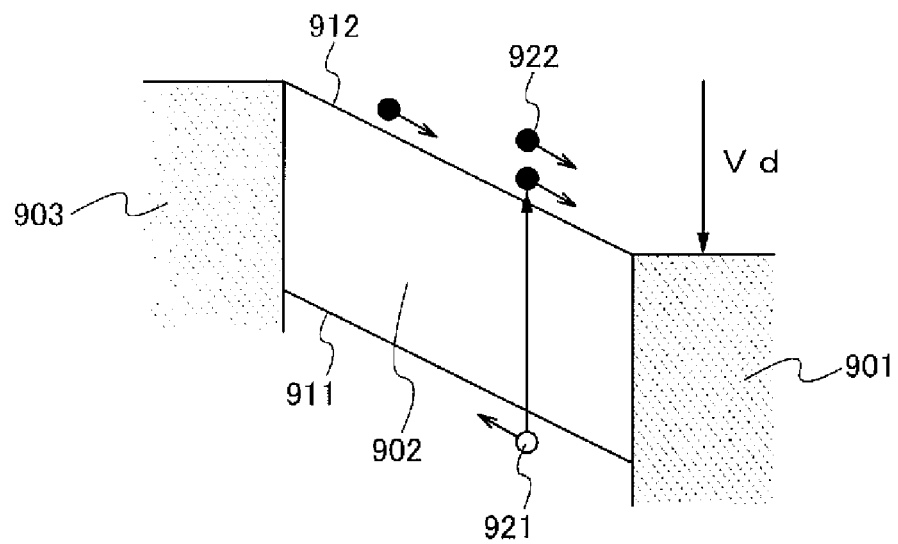
FIGS. 17A and 17B are diagrams each illustrating an avalanche breakdown.
Figure 17B:
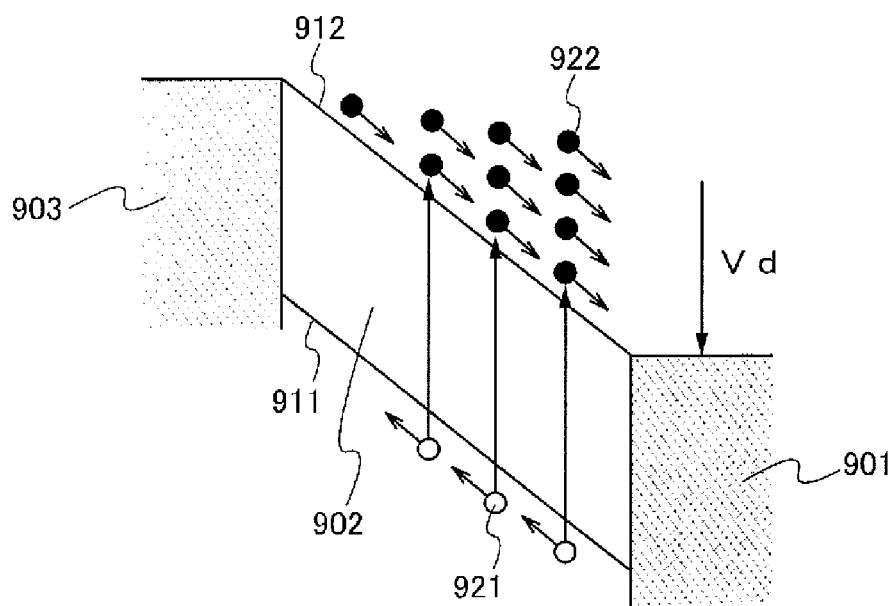

An avalanche breakdown is described using an n-channel transistor as an example, with reference to FIGS. 17A and 17B. FIGS. 17A and 17B are energy band diagrams showing a state in which a source electrode 903 and a drain electrode 901 are joined to a semiconductor 902 and a voltage Vd is applied to the drain electrode 901.

When an electron that is a carrier is accelerated by a high electric field in a depletion layer and impacts a lattice, an electron in the lattice is knocked out; as a result, an electron 922 and a hole 921 (electron-hole pair) are generated (FIG. 17A). This phenomenon is called impact ionization. The impact ionization occurs frequently after the electric field of the semiconductor reaches a predetermined threshold value.

When the voltage Vd which is applied to the drain electrode 901 is increased to exceed the threshold value, the electron-hole pair generated by the impact ionization is further accelerated to cause impact ionization again. An electron-hole pair generated at that time is also accelerated, and similar phenomena occur repeatedly. That is, impact ionization of one electron causes explosive generation of electron-hole pairs, which increases current flowing between the source and the drain exponentially (FIG. 17B). This phenomenon is called an avalanche breakdown.

In order to generate an electron-hole pair due to impact ionization, it is necessary to excite an electron to a conduction band 912 and a hole to a valence band 911. That is, an electron which causes impact ionization needs to be accelerated until it has kinetic energy that is higher than or equal to the energy gap of the semiconductor. In other words, as the energy gap is larger, an electric field for generating impact ionization is higher; therefore, the semiconductor is resistant to an avalanche breakdown. Generation probability G of an electron-hole pair due to impact ionization is expressed by Formula 2.

$$G = \alpha_n \times n \times v_n + \alpha_p \times p \times v_p \quad \text{(Formula 2)}$$

Figure 18A:
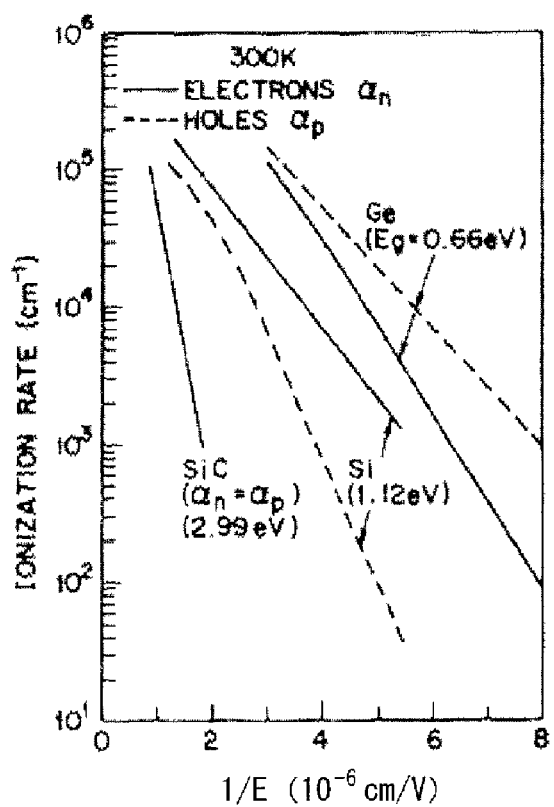
FIGS. 18A and 18B are graphs each showing a relation between ionization rates of various semiconductors and electric field intensity.
Figure 18B:
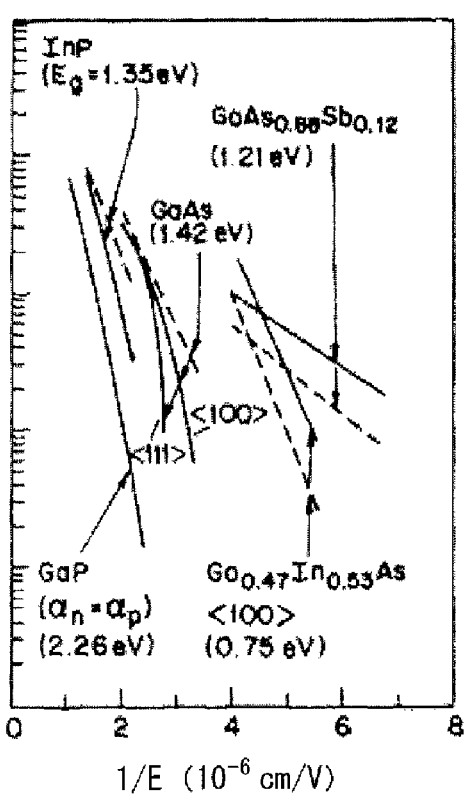

In Formula 2, $\alpha_n$ and $\alpha_p$ represent ionization coefficients of an electron and a hole (the number of impact ionization which is caused when an electron and a hole are moved by a unit length), n and p represent electron density and hole density, and $v_n$ and $v_p$ represent the speed of an electron and the speed of a hole. An ionization coefficient is determined by physical properties of a material. As an ionization coefficient is smaller, the number of impact ionization is smaller; in such a case, an avalanche breakdown is unlikely to be caused. An ionization coefficient is determined on the basis of experimental data. FIGS. 18A and 18B each show the relation between ionization rates of various semiconductors and electric field intensity (reciprocal), which is an excerpt from "Physics of Semiconductor Devices" by S. M. Sze.

In FIGS. 18A and 18B, as the curve is closer to the left side, an electric field which causes impact ionization is higher and resistance to an avalanche breakdown is higher. The numeric value in parentheses represents an energy gap. As the energy gap is larger, resistance to an avalanche breakdown is higher.

Figure 2A:
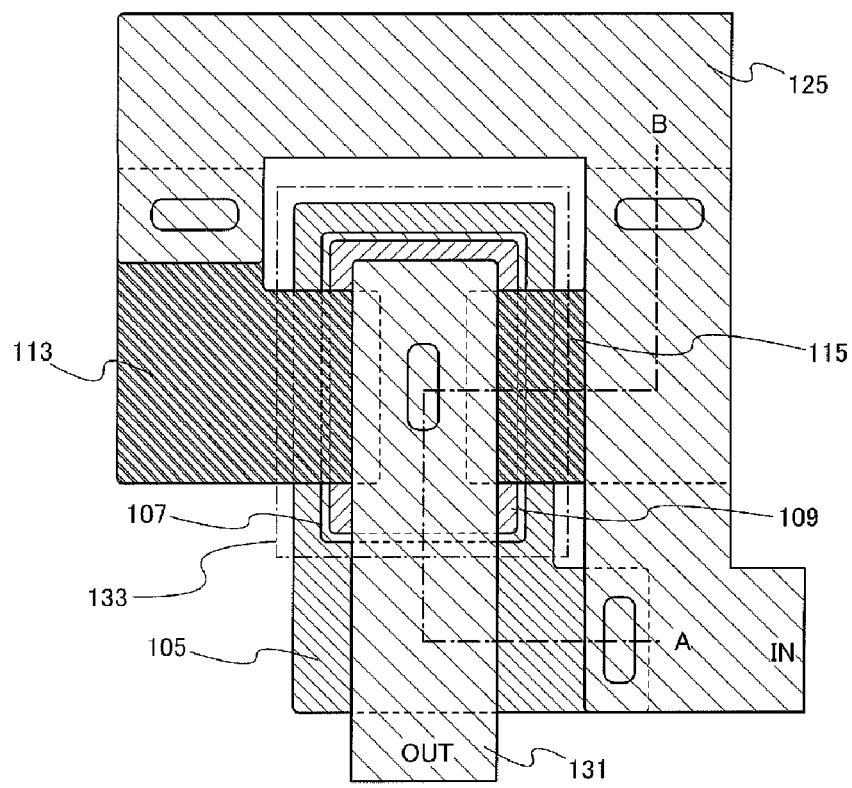
FIGS. 2A and 2B are a top view and a cross-sectional view illustrating a diode according to an embodiment of the present invention.
Figure 2B:
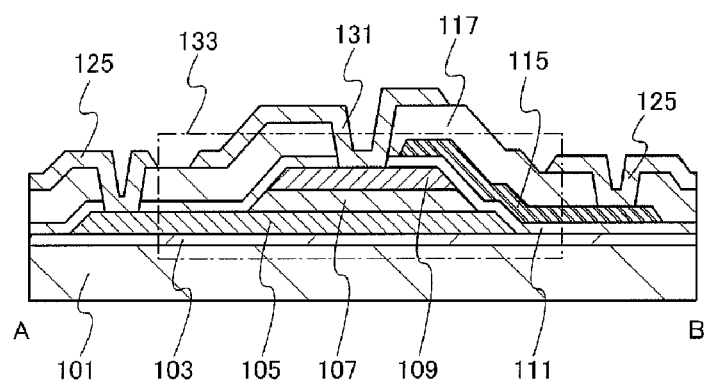

FIGS. 2A and 2B illustrate another structure of the diode using the vertical transistor including the oxide semiconductor described with reference to FIGS. 1A and 1B. In the diode illustrated in FIGS. 2A and 2B, a wiring 125 is connected to a third electrode 113, a third electrode 115, and a first electrode 105. The first electrode 105 is connected to a second electrode 109 through an oxide semiconductor layer 107. The second electrode 109 is connected to a wiring 131.

In the diode illustrated in FIGS. 2A and 2B, the wiring 125 is provided so as not to overlap with other electrodes and the like; therefore, parasitic capacitance generated between the wiring 125 and other electrodes can be suppressed.

Figure 3A:
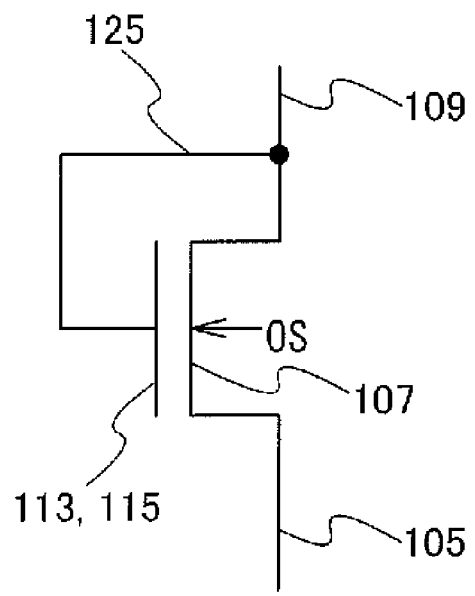
FIGS. 3A and 3B are diagrams each illustrating a diode according to an embodiment of the present invention.
Figure 3B:
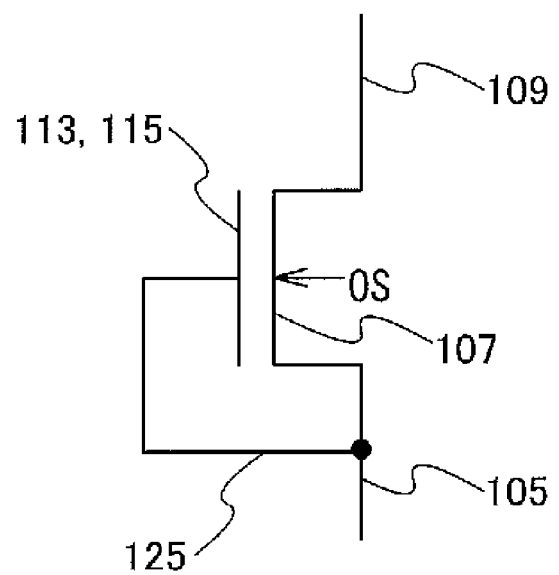

FIGS. 3A and 3B each illustrate, using a circuit symbol, the diode with the use of the n-channel transistor including the oxide semiconductor (OS) illustrated in FIGS. 1A and 1B or FIGS. 2A and 2B. FIG. 3A shows a circuit symbol of the diode with the use of the n-channel transistor including the oxide semiconductor (OS) illustrated in FIGS. 1A and 1B and a state in which the second electrode 109 is connected to the third electrode 113 and the third electrode 115 through the wiring 125. When a voltage (a positive voltage) higher than that of the first electrode 105 is applied to the second electrode 109, the positive voltage is also applied to the third electrode 113 and the third electrode 115 which serve as the gate electrode, whereby the transistor 133 is turned on and current flows between the first electrode 105 and the second electrode 109.

On the other hand, when a voltage (a negative voltage) lower than that of the first electrode 105 is applied to the second electrode 109, the transistor 133 is turned off and current scarcely flows between the first electrode 105 and the second electrode 109. In this case, the second electrode 109 of the transistor 133 serves as a drain (a drain electrode) and the first electrode 105 serves as a source (a source electrode). In this manner, the transistor 133 including the highly purified oxide semiconductor whose hydrogen concentration is reduced can serve as a diode in which the second electrode 109 is used as an anode and the first electrode 105 is used as a cathode.

FIG. 3B shows a circuit symbol of the diode with the use of the n-channel transistor including the oxide semiconductor (OS) illustrated in FIGS. 2A and 2B and a state in which the first electrode 105 is connected to the third electrode 113 and the third electrode 115 through the wiring 125. When a voltage (positive voltage) higher than that of the second electrode 109 is applied to the first electrode 105, the positive voltage is also applied to the third electrode 113 and the third electrode 115 which serve as the gate electrode, whereby the transistor 133 is turned on and current flows between the first electrode 105 and the second electrode 109.

On the other hand, when a voltage (negative voltage) lower than that of the second electrode 109 is applied to the first electrode 105, the transistor 133 is turned off and current scarcely flows between the first electrode 105 and the second electrode 109. In this case, the second electrode 109 of the transistor 133 serves as a source (a source electrode) and the first electrode 105 serves as a drain (a drain electrode). In this manner, the transistor 133 including the highly purified oxide semiconductor whose hydrogen concentration is reduced can serve as a diode in which the first electrode 105 is used as an anode and the second electrode 109 is used as a cathode.

In addition, when an area of contact between the drain electrode and the oxide semiconductor layer is made larger than an area of contact between the source electrode and the oxide semiconductor layer, current vs. voltage characteristics particularly in forward bias can be improved.

In addition, when the area of contact between the drain electrode and the oxide semiconductor layer is made smaller than the area of contact between the source electrode and the oxide semiconductor layer, current vs. voltage characteristics particularly in reverse bias can be improved.

By using the vertical transistor including the oxide semiconductor described in this embodiment as a diode, a diode which has an excellent rectification property and is resistant to an avalanche breakdown (i.e., has high withstand voltage) can be manufactured.

In addition, a work function of the electrode which serves as the drain of the transistor 133 and is in contact with the oxide semiconductor layer 107 is $\phi md$, a work function of the electrode which serves as the source of the transistor 133 and is in contact with the oxide semiconductor layer 107 is $\phi ms$, and electron affinity of the oxide semiconductor layer 107 is $\chi$. When $\phi md$, $\phi ms$, and $\chi$ satisfy Formula 1, the rectification property of the diode-connected transistor 133 can be further improved.

$$\phi ms \leq \chi < \phi md \quad \text{Formula 1}$$

When the transistor 133 has the structure illustrated in FIGS. 1A and 1B, the work function of the first electrode 105 is $\phi ms$ and the work function of the second electrode 109 is $\phi md$. In addition, when the transistor 133 has the structure illustrated in FIGS. 2A and 2B, the work function of the first electrode 105 is $\phi md$ and the work function of the second electrode 109 is $\phi ms$.

When the first electrode 105 or the second electrode 109 has a stacked structure including two or more layers, the work function of a layer in contact with the oxide semiconductor layer 107 and the electron affinity of the oxide semiconductor layer 107 may satisfy Formula 1.

For example, when the electron affinity ($\chi$) of the oxide semiconductor is 4.3 eV, tungsten (W), molybdenum (Mo), chromium (Cr), iron (Fe), gold (Au), platinum (Pt), copper (Cu), cobalt (Co), nickel (Ni), beryllium (Be), indium tin oxide (ITO), or the like can be given as an example of a conductive material with a work function that is higher than the electron affinity of the oxide semiconductor.

In addition, when the electron affinity ($\chi$) of the oxide semiconductor is 4.3 eV, titanium (Ti), yttrium (Y), aluminum (Al), zirconium (Zr), magnesium (Mg), silver (Ag), manganese (Mn), tantalum (Ta), tantalum nitride, titanium nitride, or the like can be given as an example of a conductive material with a work function that is lower than or equal to the electron affinity of the oxide semiconductor.

Figure 4A:
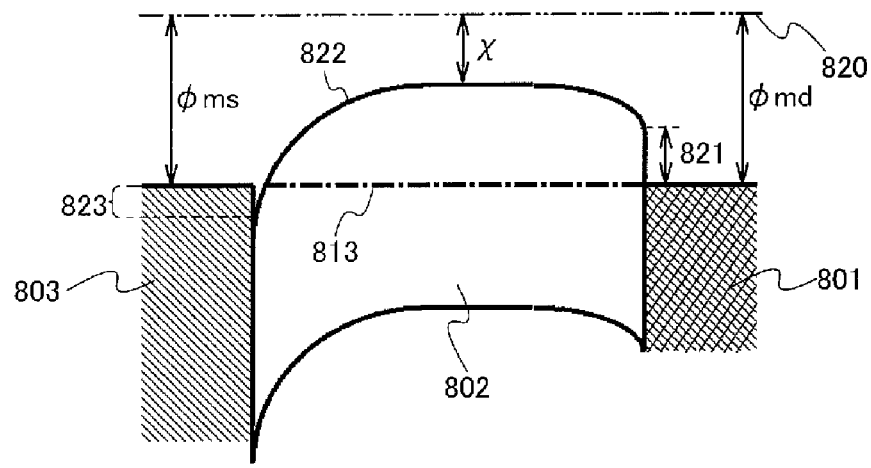
FIGS. 4A to 4C are band diagrams illustrating a diode according to an embodiment of the present invention.
Figure 4B:
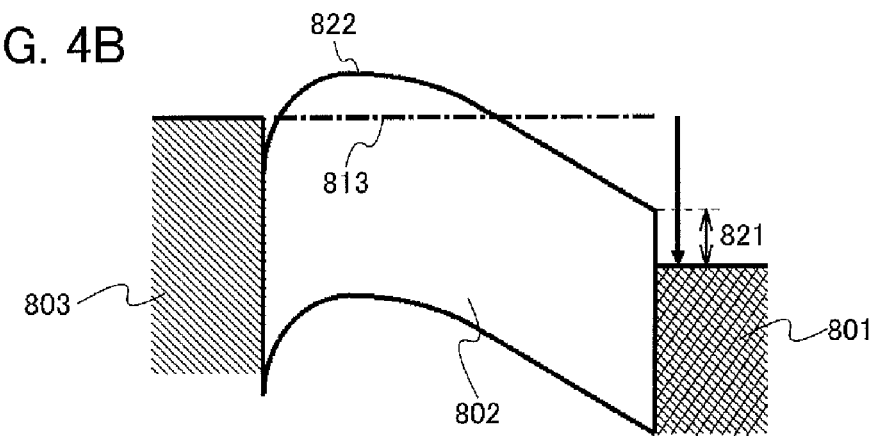
Figure 4C:
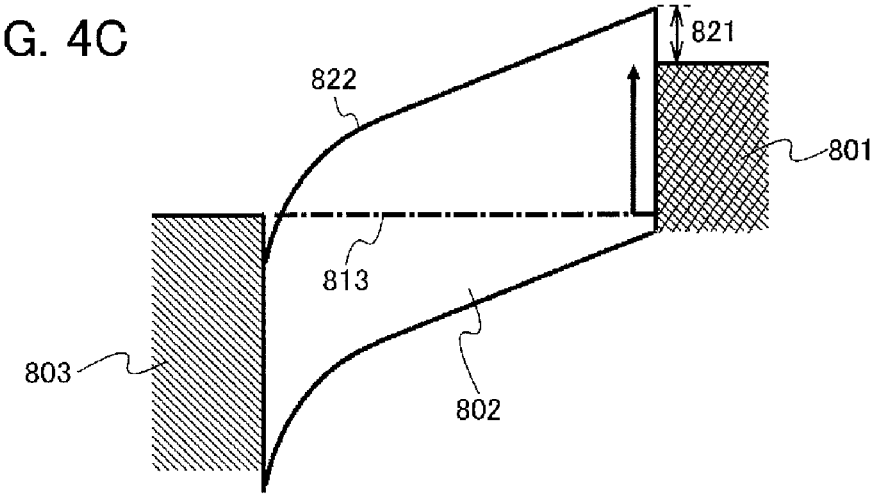

A rectification property of a structure which satisfies Formula 1 is described using band diagrams in FIGS. 4A to 4C. FIGS. 4A to 4C are band diagrams each illustrating a state in which a conductive material 801 having a work function $\phi$md and a conductive material 803 having a work function $\phi$ms are joined to a highly purified oxide semiconductor 802 (including an i-type or substantially i-type oxide semiconductor).

Note that a highly purified oxide semiconductor includes an oxide semiconductor in which hydrogen or an OH group is removed so that the hydrogen concentration is set to $5 \times 10^{19}$/cm$^3$ or lower, preferably $5 \times 10^{18}$/cm$^3$ or lower, more preferably $5 \times 10^{17}$/cm$^3$ or lower, or lower than $1 \times 10^{16}$/cm$^3$ and the carrier density is set to lower than $1 \times 10^{12}$/cm$^3$, preferably lower than $1 \times 10^{11}$/cm$^3$.

FIG. 4A is a band diagram when the conductive material 801 and the conductive material 803 have the same potential (a thermal equilibrium state). A Fermi level 813 is a Fermi level of the conductive material 803, and Fermi levels of the conductive material 801, the conductive material 803, and the oxide semiconductor 802 are equal to each other. A level 820 is a vacuum level.

An energy barrier 821 is a difference in energy ($\phi$md–$\chi$) between a work function $\phi$md of the conductive material 801 and electron affinity $\chi$ of the oxide semiconductor 802. In addition, an energy barrier 823 is a difference in energy ($\phi$ms–$\chi$) between a work function $\phi$ms of the conductive material 803 and the electron affinity $\chi$ of the oxide semiconductor 802.

Since the work function $\phi$md of the conductive material 801 is higher than the electron affinity $\chi$ of the oxide semiconductor 802, the energy barrier 821 has a positive value. Therefore, electrons in the conductive material 801 are blocked by the energy barrier 821 and can hardly move to a conduction band 822 of the oxide semiconductor 802.

On the other hand, since the work function $\phi$ms of the conductive material 803 is lower than or equal to the electron affinity $\chi$ of the oxide semiconductor 802, the energy barrier 823 has a negative value. Therefore, electrons in the conductive material 803 can easily move to the conduction band 822 of the oxide semiconductor 802.

When the conductive material 801 and the conductive material 803 have the same potential (a thermal equilibrium state), a conduction band edge which is upwardly projected becomes a barrier against electron transfer, and thus, electrons cannot move to the conductive material 801. That is, current does not flow between the conductive material 801 and the conductive material 803.

FIG. 4B is a band diagram illustrating a state in which positive voltage (forward voltage or forward bias) is applied to the conductive material 801. The application of positive voltage to the conductive material 801 moves down the Fermi level of the conductive material 801, and electrons moved to the conduction band 822 from the conductive material 803 can easily move to the conductive material 801. Therefore, current (forward current) flows between the conductive material 801 and the conductive material 803.

FIG. 4C is a band diagram illustrating a state in which negative voltage (reverse voltage or reverse bias) is applied to the conductive material 801. The application of negative voltage to the conductive material 801 moves up the Fermi level of the conductive material 801, and electrons moved to the conduction band 822 from the conductive material 803 cannot move to the conductive material 801. In addition, the energy barrier 821 is not changed, and thus, electrons in the conductive material 801 can hardly move to the conduction band 822 of the oxide semiconductor 802. However, since there are a very small number of electrons which move to the conduction band 822 over the energy barrier 821 with a certain probability, very small current (reverse current) flows between the conductive material 803 and the conductive material 801.

When Formula 1 is satisfied with the use of the conductive material having the work function $\phi$md, the oxide semiconductor having the electron affinity $\chi$, and the conductive material having the work function $\phi$ms, a rectification property can be achieved, and the rectification property of the diode with the use of the vertical transistor including the oxide semiconductor can be further improved.

Figure 5A:
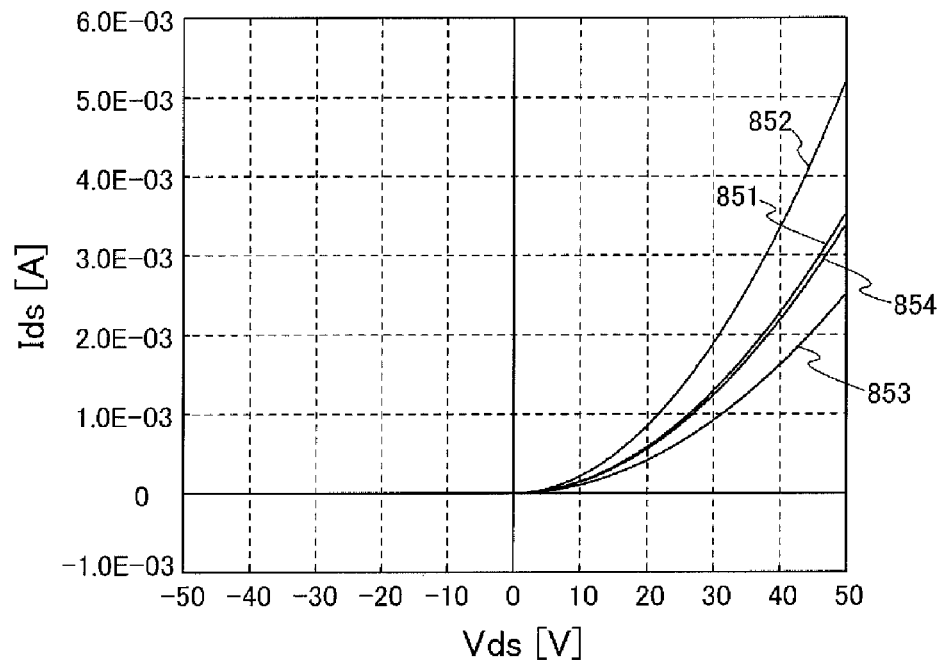
FIGS. 5A and 5B are graphs showing a simulation result of a diode according to an embodiment of the present invention.
Figure 5B:
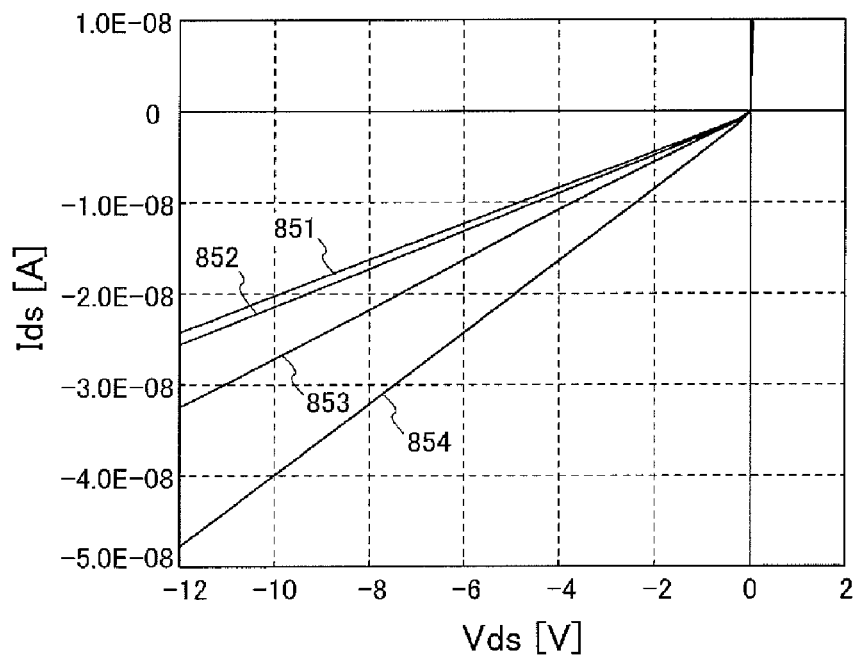

FIGS. 5A and 5B show the current vs. voltage characteristics of the diode which satisfies Formula 1 and uses the vertical transistor including the oxide semiconductor, which were obtained by device simulation. For the device simulation, software ATLAS which was made by Silvaco Data Systems Inc. was used. The condition of the device simulation was as follows: the distance between the first electrode 105 and the second electrode 109 (the thickness of the oxide semiconductor layer) was 500 nm, the area of contact between the first electrode 105 and the oxide semiconductor layer 107 was 2 µm$^2$, the area of contact between the second electrode 109 and the oxide semiconductor layer 107 was 1 µm$^2$, the electron affinity $\chi$ of the oxide semiconductor layer 107 was 4.3 eV, the work function $\phi$md of the conductive material for forming the anode (the drain electrode) was 4.7 eV, and the work function $\phi$ms of the conductive material for forming the cathode (the source electrode) was 4.3 eV. In addition, the thickness and the relative dielectric constant of a gate insulating layer of the transistor which is used as the diode were set to 100 nm and 4.0.

In each of FIGS. 5A and 5B, the horizontal axis represents voltage (Vds) between the anode and the cathode (between the drain and the source), and the positive side shows forward bias and the negative side shows reverse bias. The vertical axis represents current (Ids) between the anode and the cathode (between the drain and the source). In FIG. 5B, the scale of the vertical axis (Ids) of FIG. 5A in the range of Vds of 2 V to −12 V is changed so that reverse current in reverse bias can be easily understood.

A curve 851 represents the current vs. voltage characteristics when the diode illustrated in FIGS. 1A and 1B has a structure which satisfies Formula 1. That is, the curve 851 shows the current vs. voltage characteristics of a diode having the following structure (hereinafter referred to as a diode having a structure A): the second electrode 109 having the work function $\phi$md is used as an anode (a drain electrode), the first electrode 105 having the work function $\phi$ms is used as a cathode (a source electrode), and the second electrode 109 is electrically connected to the third electrode 113 and the third electrode 115 which serve as the gate electrode of the transistor.

A curve 852 represents the current vs. voltage characteristics when the diode illustrated in FIGS. 2A and 2B has a structure which satisfies Formula 1. That is, the curve 852 shows the current vs. voltage characteristics of a diode having the following structure (hereinafter referred to as a diode having a structure B): the first electrode 105 having the work function $\phi$md is used as an anode (a drain electrode), the second electrode 109 having the work function $\phi$ms is used as a cathode (a source electrode), and the first electrode 105 is electrically connected to the third electrode 113 and the third electrode 115 which serve as the gate electrode of the transistor.

Note that in FIGS. 5A and 5B, a curve 853 and a curve 854 are shown for reference. The curve 853 shows the current vs. voltage characteristics of a diode having the following structure (hereinafter referred to as a diode having a structure C): the second electrode 109 having the work function $\phi$md is used as an anode, the first electrode 105 having the work function $\phi$ms is used as a cathode, and the first electrode 105 is electrically connected to the third electrode 113 and the third electrode 115 which serve as the gate electrode of the transistor.

The curve 854 shows the current vs. voltage characteristics of a diode having the following structure (hereinafter referred to as a diode having a structure D): the first electrode 105 having the work function $\phi$md is used as an anode, the second electrode 109 having the work function $\phi$ms is used as a cathode, and the second electrode 109 is electrically connected to the third electrode 113 and the third electrode 115 which serve as the gate electrode of the transistor.

Figure 6A:
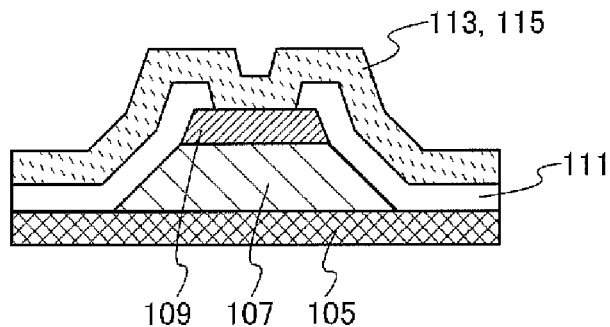
FIGS. 6A to 6D are diagrams each illustrating a diode according to an embodiment of the present invention.
Figure 6B:
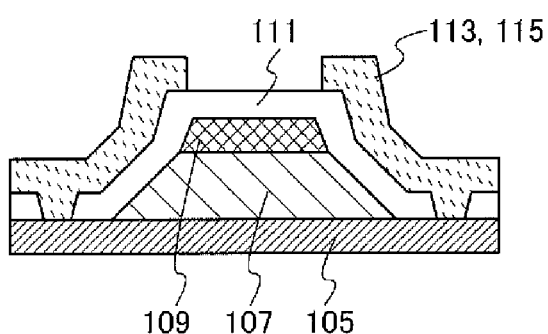
Figure 6C:
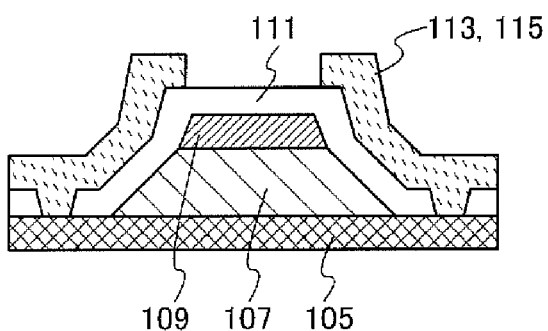
Figure 6D:
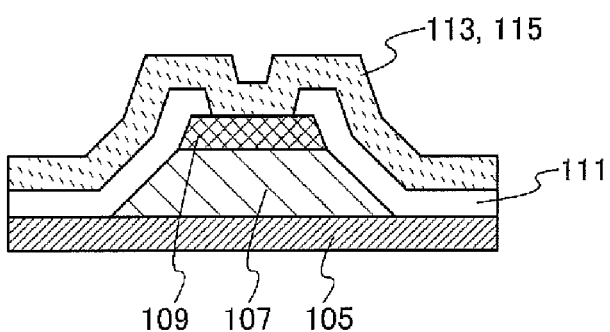

FIGS. 6A to 6D are cross-sectional schematic views which illustrate the stacked structures of the diode having the structure A to the diode having the structure D. FIG. 6A illustrates a stacked structure of the diode having the structure A, which corresponds to the diode illustrated in FIGS. 1A and 1B. FIG. 6B illustrates a stacked structure of the diode having the structure B, which corresponds to the diode illustrated in FIGS. 2A and 2B. FIG. 6C illustrates a stacked structure of the diode having the structure C, and FIG. 6D illustrates a stacked structure of the diode having the structure D. The diode having the structure C is obtained by switching the connection between the gate electrode and the drain electrode to the connection between the gate electrode and the source electrode in the diode having the structure A. In addition, the diode having the structure D is obtained by switching the connection between the gate electrode and the drain electrode in the diode having the structure B to the connection between the gate electrode and the source electrode.

FIGS. 5A and 5B show that each of the diode having the structure A (the curve 851) to the diode having the structure D (the curve 854) has an excellent rectification property. The diode having the structure A and the diode having the structure B have current vs. voltage characteristics in which forward current is large and reverse current is small as compared with the diode having the structure C and the diode having the structure D, that is, a more excellent rectification property.

Further, when the diode having the structure A (the curve 851) and the diode having the structure B (the curve 852) are compared, a more favorable forward current, which is larger, can be obtained with the diode having the structure B whereas a more favorable reverse current, which is smaller, can be obtained with the diode having the structure A. This is because the second electrode 109 is used as the drain electrode having the work function $\phi$md in the diode having the structure A, and the first electrode 105 is used as the drain electrode having the work function $\phi$md in the diode having the structure B. That is, the area of contact between the first electrode 105 and the oxide semiconductor layer 107 is larger than the area of contact between the second electrode 109 and the oxide semiconductor layer 107. That is, since the diode having the structure B has a larger area of a portion where the oxide semiconductor and the electrode are in contact with each other and the energy barrier exists than the diode having the structure A, a larger amount of forward current can flow in the diode having the structure B. In addition, since the diode having the structure A has a smaller area of a portion where the oxide semiconductor and the electrode are in contact with each other and the energy barrier exists than the diode having the structure B, the amount of reverse current can be smaller in the diode having the structure A.

As described above, when the area of contact between the oxide semiconductor layer and the first electrode 105 is made different from the area of contact between the oxide semiconductor layer and the second electrode 109 in the diode with the use of the vertical transistor including the oxide semiconductor, a diode having an excellent rectification property can be manufactured in accordance with a purpose. Specifically, the diode having the structure A is used for achieving a smaller reverse current (leakage current) and the diode having the structure B is used for achieving a larger forward current, whereby a diode having an excellent rectification property can be manufactured without changing the size of a transistor.

Even when the area of contact between the oxide semiconductor layer and the second electrode 109 is larger than the area of contact between the oxide semiconductor layer and the first electrode 105, when the transistor which has the above structure is formed, a diode having an excellent rectification property can be manufactured.

Embodiment 2

In this embodiment, an example of a non-linear element according to an embodiment of the present invention which has a structure different from that in Embodiment 1 will be described with reference to FIGS. 7A and 7B. The non-linear element described in this embodiment serves as a diode because a gate is connected to one of a source and a drain in a transistor.

Figure 7A:
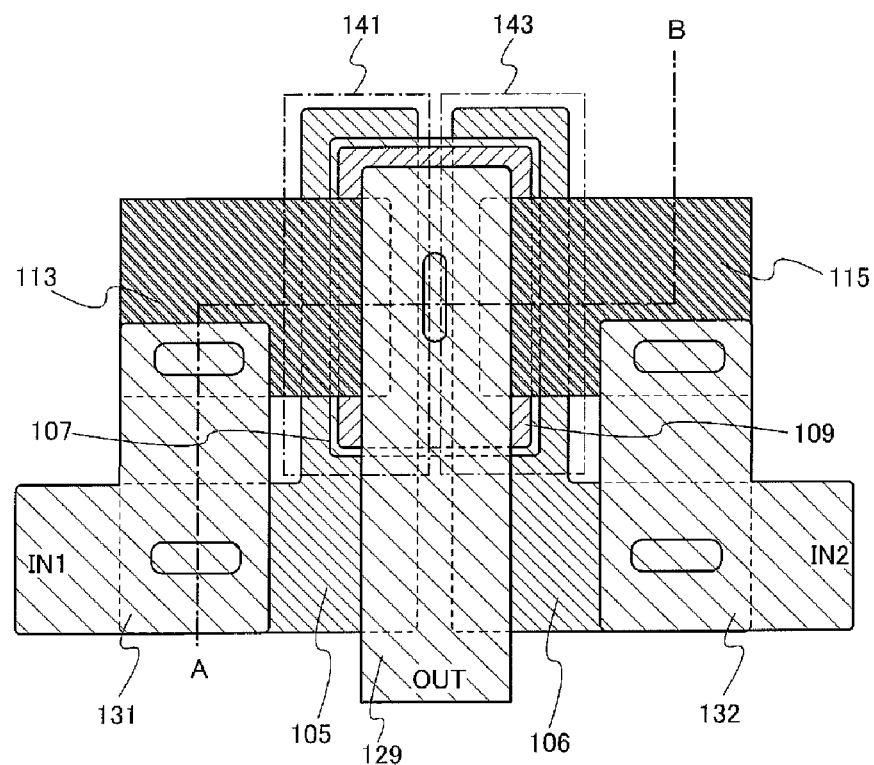
FIGS. 7A and 7B are a top view and a cross-sectional view illustrating a diode according to an embodiment of the present invention.
Figure 7B:
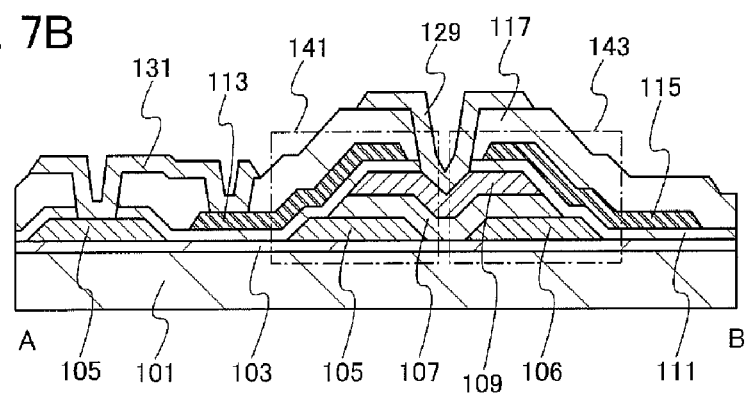

In the diode illustrated in FIGS. 7A and 7B, a wiring 131 is connected to a first electrode 105 and a third electrode 113, and a wiring 132 is connected to a first electrode 106 and a third electrode 115. The first electrode 105 and the first electrode 106 are connected to a second electrode 109 through an oxide semiconductor layer 107. The second electrode 109 is connected to a wiring 129.

FIG. 7A is a top view of diode-connected transistors 141 and 143. FIG. 7B is a cross-sectional view along dashed-and-dotted line A-B in FIG. 7A.

As illustrated in FIG. 7B, the first electrode 105, the first electrode 106, the oxide semiconductor layer 107, and the second electrode 109 are stacked over an insulating layer 103 formed over a substrate 101. A gate insulating layer 111 is provided so as to cover the first electrodes 105 and 106, the oxide semiconductor layer 107, and the second electrode 109. The third electrode 113 and the third electrode 115 are provided over the gate insulating layer 111. An insulating layer 117 that serves as an interlayer insulating layer is provided over the gate insulating layer 111 and the third electrodes 113 and 115. The wiring 129, the wiring 131, and the wiring 132 are formed over the insulating layer 117. A plurality of openings are formed in the insulating layer 117. The third electrode 113 is connected to the wiring 131, and the third electrode 115 is connected to the wiring 132, each through the opening. In addition, the wiring 129 is connected to the second electrode 109 through the opening provided in the insulating layer 117 and the gate insulating layer 111.

The first electrode 105 serves as one of a source electrode and a drain electrode of the transistor 141. The first electrode 106 serves as one of a source electrode and a drain electrode of the transistor 143. The second electrode 109 serves as the other of the source electrode and the drain electrode of each of the transistors 141 and 143. The third electrode 113 serves as a gate electrode of the transistor 141. The third electrode 115 serves as a gate electrode of the transistor 143.

In this embodiment, the transistor 141 and the transistor 143 are connected to the wiring 129 through the second electrode 109. A signal which is input to the wiring 131 is output to the wiring 129 through the transistor 141, and a signal which is input to the wiring 132 is output to the wiring 129 through the transistor 143.

Although the first electrode 105 and the first electrode 106 are separated in this embodiment, by electrically connecting the first electrode 105 and the first electrode 106 to each other, the transistor 141 and the transistor 143 can be connected in parallel. By connecting the transistors in parallel, a larger amount of current can flow.

The transistors 141 and 143 of this embodiment are formed using a highly purified oxide semiconductor layer whose hydrogen concentration is reduced, in a manner similar to that of Embodiment 1. Therefore, favorable operation of the transistor can be obtained. In particular, off current can be decreased. As a result of this, a transistor which has high operation speed and in which a large amount of current can flow in an on state and almost no current flows in an off state can be manufactured. By connecting a source or a drain of such a transistor to a gate thereof, a diode in which forward current is large and reverse current is small can be manufactured. Therefore, a diode which is resistant to an avalanche breakdown (i.e., has high withstand voltage) can be manufactured.

Note that the diode described in this embodiment is not limited to that illustrated in FIGS. 7A and 7B. In the diode illustrated in FIGS. 7A and 7B, current flows through the oxide semiconductor layer 107 from the first electrode 105 or the first electrode 106 to the second electrode 109. A structure in which current flows through the oxide semiconductor layer 107 from the second electrode 109 to the first electrode 105 or the first electrode 106 as illustrated in FIGS. 8A and 8B may be employed.

Figure 8A:
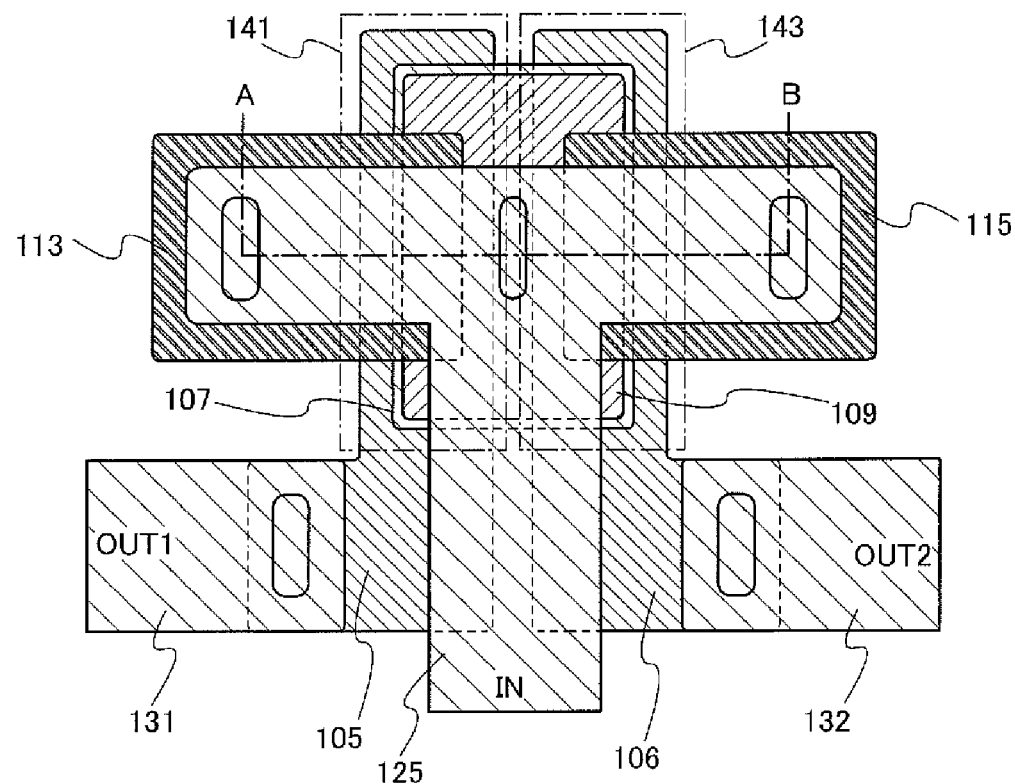
FIGS. 8A and 8B are a top view and a cross-sectional view illustrating a diode according to an embodiment of the present invention.
Figure 8B:
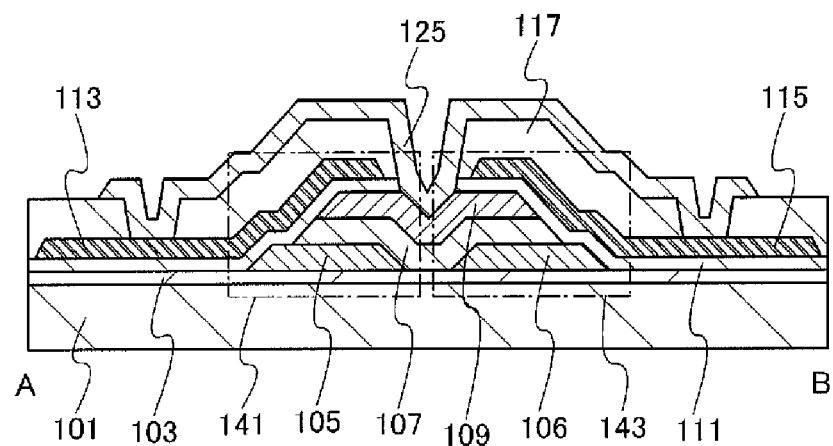

In the diode illustrated in FIGS. 8A and 8B, a wiring 125 is connected to a third electrode 113, a third electrode 115, and a second electrode 109. The second electrode 109 is connected to a first electrode 105 and a first electrode 106 through an oxide semiconductor layer 107. The first electrode 105 is connected to a wiring 131, and the first electrode 106 is connected to a wiring 132.

In the diode illustrated in FIGS. 8A and 8B, the wiring 125 is provided so as to overlap with a transistor 141 and a transistor 143. However, without limitation thereto, the wiring 125 may be provided so as not to overlap with the transistor 141 and the transistor 143 as in FIGS. 2A and 2B. When the wiring 125 does not overlap with the transistor 141 and the transistor 143, parasitic capacitance generated between the wiring 125 and electrodes of the transistors can be suppressed.

In addition, by applying the structure disclosed in Embodiment 1 to the diode of this embodiment, the rectification property can be more excellent.

Embodiment 3

In this embodiment, an example of a non-linear element according to an embodiment of the present invention which has a structure different from that in Embodiment 1 will be described with reference to FIGS. 9A and 9B. The non-linear element described in this embodiment functions as a diode because a gate is connected to one of a source and a drain in a transistor.

Figure 9A:
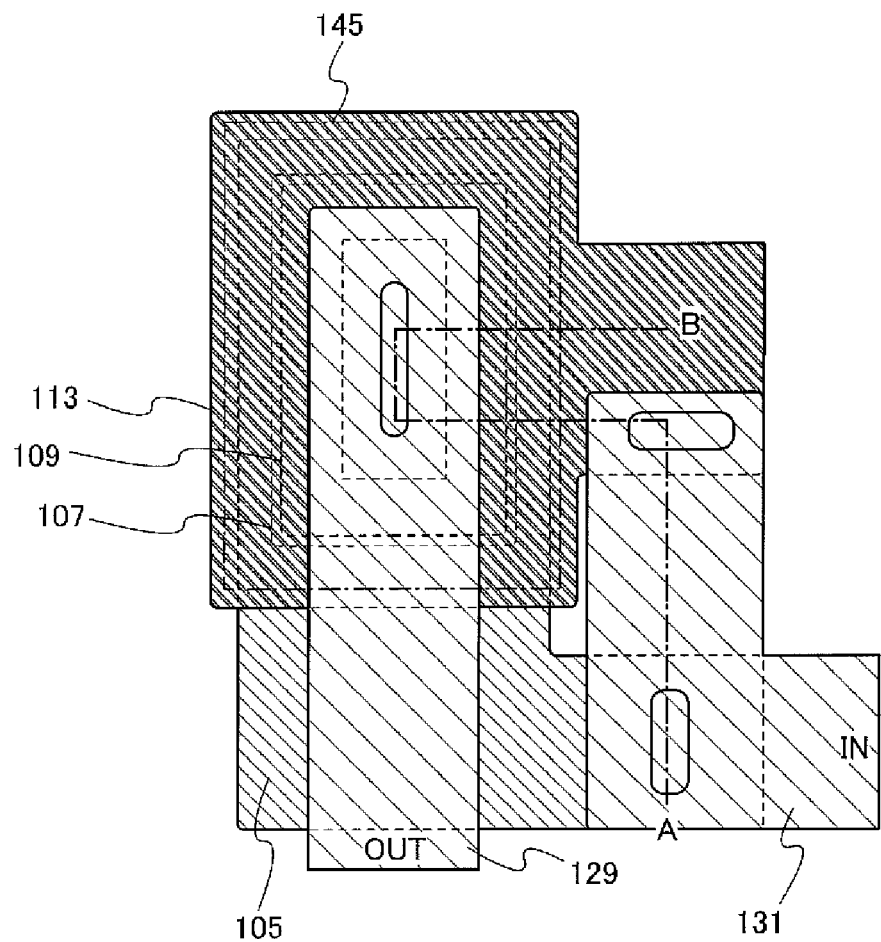
FIGS. 9A and 9B are a top view and a cross-sectional view illustrating a diode according to an embodiment of the present invention.
Figure 9B:
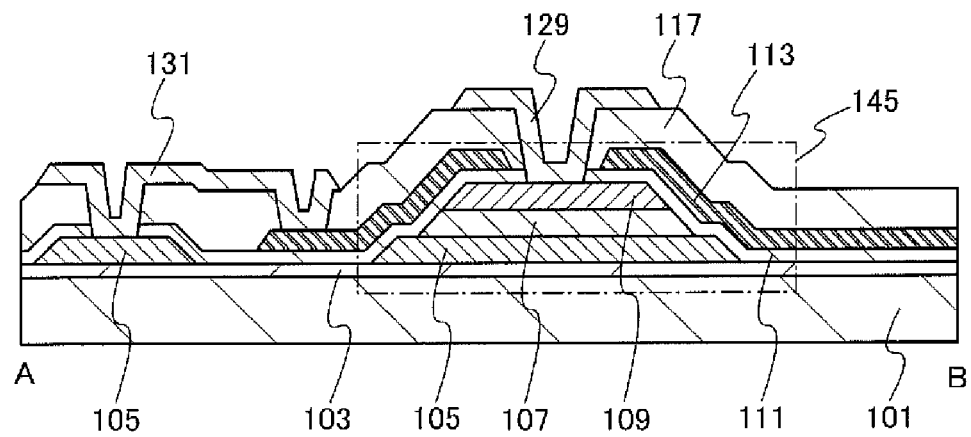

In the diode illustrated in FIGS. 9A and 9B, a wiring 131 is connected to a first electrode 105 and a third electrode 113. The first electrode 105 is connected to a second electrode 109 through an oxide semiconductor layer 107. The second electrode 109 is connected to a wiring 129.

FIG. 9A is a top view of a diode-connected transistor 145. FIG. 9B is a cross-sectional view along dashed-and-dotted line A-B in FIG. 9A.

As illustrated in FIG. 9B, the first electrode 105, the oxide semiconductor layer 107, and the second electrode 109 are stacked over an insulating layer 103 formed over a substrate 101. A gate insulating layer 111 is provided so as to cover the first electrode 105, the oxide semiconductor layer 107, and the second electrode 109. The third electrode 113 is provided over the gate insulating layer 111. An insulating layer 117 serving as an interlayer insulating layer is provided over the gate insulating layer 111 and the third electrode 113. A plurality of openings are formed in the insulating layer 117. The wiring 131 connected to the first electrode 105, and the wiring 129 connected to the second electrode 109 and the third electrode 113 through the each opening are formed (see FIG. 9A).

The first electrode 105 serves as one of a source electrode and a drain electrode of the transistor 145. The second electrode 109 serves as the other of the source electrode and the drain electrode of the transistor 145. The third electrode 113 serves as a gate electrode of the transistor 145.

In this embodiment, the third electrode 113 serving as the gate electrode has a ring shape. When the third electrode 113 serving as the gate electrode has a ring shape, the channel width of the transistor can be increased. Accordingly, on current of the transistor can be increased.

The transistor 145 of this embodiment is formed using a highly purified oxide semiconductor layer whose hydrogen concentration is reduced, in a manner similar to that of Embodiment 1. Therefore, favorable operation of the transistor can be obtained. Furthermore, off current can be decreased. As a result of this, a transistor which has high operation speed and in which a large amount of current can flow in an on state and almost no current flows in an off state can be manufactured. By connecting a source or a drain of such a transistor to a gate thereof, a diode in which forward current is large and reverse current is small can be manufactured. Therefore, a diode which is resistant to an avalanche breakdown (i.e., has high withstand voltage) can be manufactured.

Note that the diode described in this embodiment is not limited to that illustrated in FIGS. 9A and 9B. In the diode illustrated in FIGS. 9A and 9B, current flows through the oxide semiconductor layer 107 from the first electrode 105 to the second electrode 109. A structure in which current flows through the oxide semiconductor layer 107 from the second electrode 109 to the first electrode 105 as illustrated in FIGS. 10A and 10B may be employed.

Figure 10A:
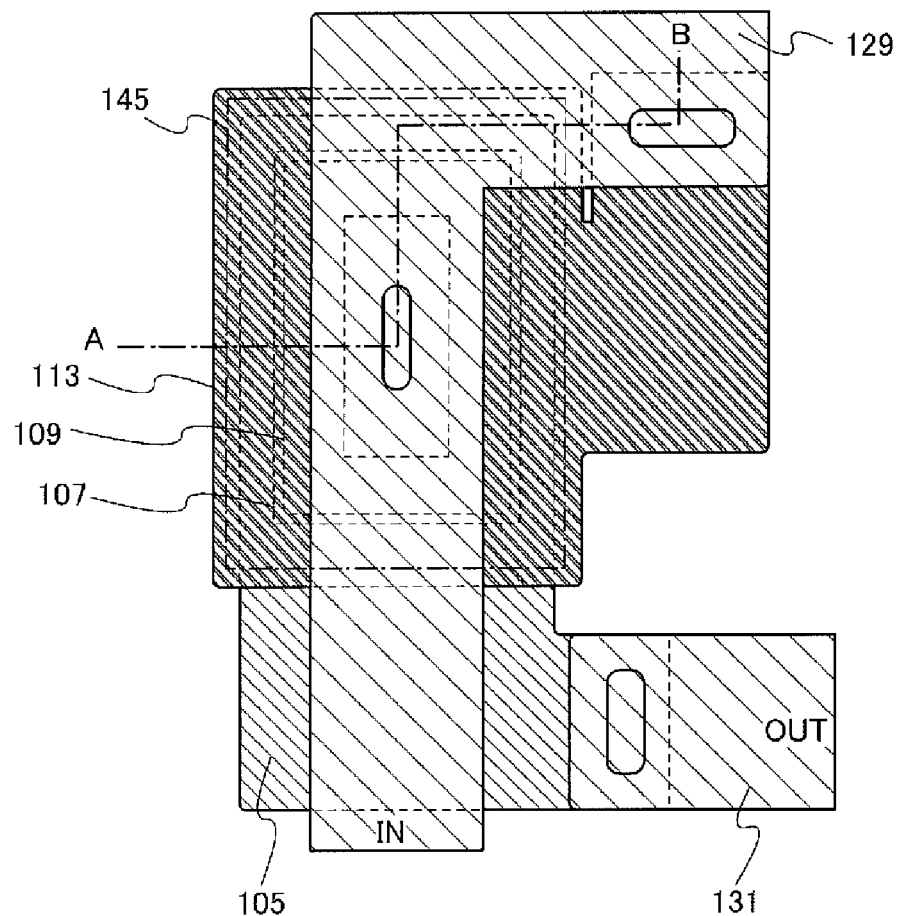
FIGS. 10A and 10B are a top view and a cross-sectional view illustrating a diode according to an embodiment of the present invention.
Figure 10B:
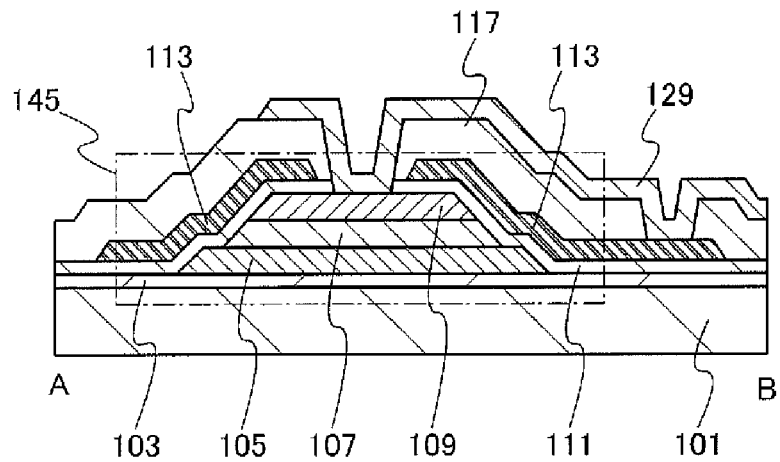

In the diode illustrated in FIGS. 10A and 10B, a wiring 129 is connected to a second electrode 109 and a third electrode 113. The second electrode 109 is connected to a first electrode 105 through an oxide semiconductor layer 107. The first electrode 105 is connected to a wiring 131.

In addition, by applying the structure disclosed in Embodiment 1 to the diode of this embodiment, the rectification property can be more excellent.

Embodiment 4

In this embodiment, a manufacturing process of the diode-connected transistor illustrated in FIGS. 1A and 1B will be described with reference to FIGS. 11A to 11E.

Figure 11A:
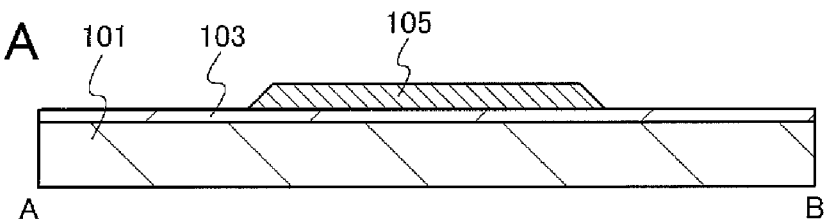
FIGS. 11A to 11E are cross-sectional views illustrating a method for manufacturing a diode according to an embodiment of the present invention.

As illustrated in FIG. 11A, the insulating layer 103 is formed over the substrate 101, and the first electrode 105 is formed over the insulating layer 103. The first electrode 105 serves as one of the source electrode and the drain electrode of the transistor.

The insulating layer 103 can be formed by a sputtering method, a CVD method, a coating method, or the like.

Note that when the insulating layer 103 is formed by a sputtering method, the insulating layer 103 is preferably formed while hydrogen, water, a hydroxyl group, hydride, or the like remaining in a treatment chamber is removed. This is for preventing hydrogen, water, a hydroxyl group, hydride, or the like from being contained in the insulating layer 103. It is preferable to use an entrapment vacuum pump in order to remove hydrogen, water, a hydroxyl group, hydride, or the like remaining in the treatment chamber. As the entrapment vacuum pump, a cryopump, an ion pump, or a titanium sublimation pump is preferably used, for example. In addition, as an evacuation unit, a turbo pump provided with a cold trap may be used. Hydrogen, water, a hydroxyl group, hydride, or the like is removed from the treatment chamber which is evacuated with a cryopump; thus, when the insulating layer 103 is formed in the treatment chamber, the concentration of impurities contained in the insulating layer 103 can be reduced.

As a sputtering gas used for forming the insulating layer 103, a high-purity gas is preferably used in which impurities such as hydrogen, water, a hydroxyl group, or hydride are reduced to a concentration of a "ppm" level or a "ppb" level.

Examples of a sputtering method include an RF sputtering method in which a high-frequency power source is used for a sputtering power source, a DC sputtering method in which a DC power source is used, and a pulsed DC sputtering method in which a bias is applied in a pulsed manner. An RF sputtering method is mainly used in the case where an insulating layer is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

Alternatively, a sputtering apparatus provided with a magnet system inside a chamber and used for a magnetron sputtering method, or a sputtering apparatus used for an ECR sputtering method in which plasma generated with the use of microwaves is used without using glow discharge can be used.

Further, as a sputtering method, a reactive sputtering method in which a target substance and a sputtering gas component are chemically reacted with each other during deposition to form a thin compound film thereof, or a bias sputtering method in which voltage is also applied to a substrate during deposition can be used.

For the sputtering in this specification, the above-described sputtering apparatus and sputtering method can be employed as appropriate.

In this embodiment, a silicon oxide film is formed as the insulating layer 103 over the substrate 101 in such a manner that the substrate 101 is introduced into the treatment chamber, a sputtering gas containing high-purity oxygen from which hydrogen, water, a hydroxyl group, hydride, or the like is removed is introduced into the treatment chamber, and a silicon target is used. Note that when the insulating layer 103 is formed, the substrate 101 may be heated.

For example, the silicon oxide film is formed by an RF sputtering method under the following conditions: quartz (preferably, synthesized quartz) is used, the substrate temperature is 108° C., the distance between the target and the substrate (the T-S distance) is 60 mm, the pressure is 0.4 Pa, the power of the high frequency power source is 1.5 kW, and the atmosphere contains oxygen and argon (the flow ratio of oxygen to argon is 1:1 (each flow rate is 25 sccm)). The film thickness may be 100 μm, for example. Note that instead of quartz (preferably, synthesized quartz), a silicon target can be used. Note that as the sputtering gas, oxygen, or a mixed gas of oxygen and argon is used.

When the insulating layer 103 is formed using a stacked structure, for example, a silicon nitride film is formed using a silicon target and a sputtering gas containing high-purity nitrogen, from which hydrogen, water, a hydroxyl group, hydride, or the like is removed, between the silicon oxide film and the substrate. Also in this case, it is preferable that the silicon nitride film be formed while hydrogen, water, a hydroxyl group, hydride, or the like remaining in the treatment chamber is removed in a manner similar to that of the silicon oxide film. Note that in the process, the substrate 101 may be heated.

In the case where the silicon nitride film and the silicon oxide film are stacked to form the insulating layer 103, the silicon nitride film and the silicon oxide film can be formed in the same treatment chamber using the same silicon target. A sputtering gas containing nitrogen is introduced into the treatment chamber first, and the silicon nitride film is formed using a silicon target provided in the treatment chamber; next, the sputtering gas containing nitrogen is switched to a sputtering gas containing oxygen and the silicon oxide film is formed using the same silicon target. The silicon nitride film and the silicon oxide film can be formed in succession without being exposed to the air; therefore, impurities such as hydrogen, water, a hydroxyl group, or hydride can be prevented from being adsorbed on the surface of the silicon nitride film.

The first electrode 105 can be formed in such a manner that a conductive layer is formed over the substrate 101 by a sputtering method, a CVD method, or a vacuum evaporation method, a resist mask is formed over the conductive layer in a photolithography step, and the conductive layer is etched using the resist mask. Alternatively, by forming the first electrode 105 by a printing method or an ink-jet method without using a photolithography step, the number of steps can be reduced. Note that the end portions of the first electrode 105 preferably have a tapered shape because the coverage with the gate insulating layer formed later can be improved. When the angle between the end portion of the first electrode 105 and the insulating layer 103 is smaller than 90°, preferably smaller than 80°, more preferably smaller than 70°, the coverage with the gate insulating layer formed later can be improved.

As the conductive layer for forming the first electrode 105, a single layer or stacked layers using one or more of tungsten (W), molybdenum (Mo), chromium (Cr), iron (Fe), indium tin oxide (ITO), titanium (Ti), yttrium (Y), aluminum (Al), magnesium (Mg), silver (Ag), zirconium (Zr), and the like can be used.

In this embodiment, as the conductive layer for forming the first electrode 105, by a sputtering method, a titanium layer is formed to have a thickness of 50 nm, an aluminum layer is formed to have a thickness of 100 nm, and a titanium layer is formed to have a thickness of 50 nm. Then, the conductive layer is etched with the use of a resist mask formed through a photolithography step, thereby forming the first electrode 105. A material of the first electrode 105 that is in contact with the oxide semiconductor layer formed later can also be selected in consideration of the relation between the electron affinity and the work function which is described in Embodiment 1.

Figure 11B:
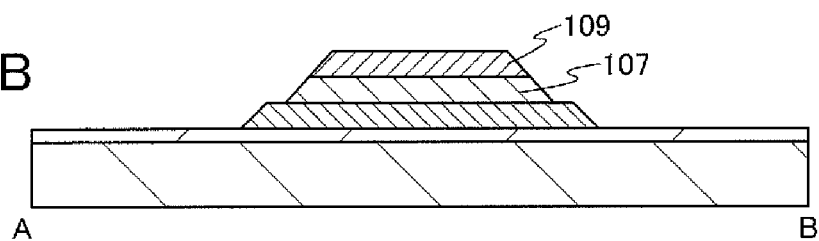

Next, as illustrated in FIG. 11B, the oxide semiconductor layer 107 and the second electrode 109 are formed over the first electrode 105. The oxide semiconductor layer 107 serves as a channel formation region of the transistor, and the second electrode 109 serves as the other of the source electrode and the drain electrode of the transistor.

Here, a method for manufacturing the oxide semiconductor layer 107 and the second electrode 109 is described.

An oxide semiconductor layer is formed by a sputtering method over the substrate 101 and the first electrode 105. Next, a conductive layer is formed over the oxide semiconductor layer.

As pretreatment, it is preferable that the substrate 101 provided with the first electrode 105 be preheated in a preheating chamber of a sputtering apparatus and impurities such as hydrogen, water, a hydroxyl group, or hydride attached to the substrate 101 be eliminated and removed so that hydrogen is contained in the oxide semiconductor layer 107 as little as possible. Note that as an evacuation unit provided in the preheating chamber, a cryopump is preferably used. Note also that this preheating treatment can be omitted. In addition, this preheating may be performed on the substrate 101 before the formation of the gate insulating layer 111 formed later, or may be performed on the substrate 101 before the formation of the third electrode 113 and the third electrode 115 formed later.

Note that before the oxide semiconductor layer is formed by a sputtering method, reverse sputtering in which plasma is generated with an argon gas introduced is preferably performed to remove dust attached to or an oxide layer formed on the surface of the first electrode 105, so that resistance at the interface between the first electrode 105 and the oxide semiconductor layer can be reduced. The reverse sputtering refers to a method in which, without application of voltage to a target side, a high-frequency power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used.

In this embodiment, the oxide semiconductor layer is formed by a sputtering method with the use of an In—Ga—Zn—O-based metal oxide target. Further, the oxide semiconductor layer can be formed with a sputtering method in a rare gas (typically, argon) atmosphere, an oxygen atmosphere, or an atmosphere containing a rare gas (typically, argon) and oxygen. When a sputtering method is employed, a target containing $SiO_2$ at 2 wt % to 10 wt % inclusive may be used.

As a sputtering gas used for forming the oxide semiconductor layer, a high-purity gas is preferably used in which impurities such as hydrogen, water, a hydroxyl group, or hydride are reduced to a concentration of a "ppm" level or a "ppb" level.

As a target for forming the oxide semiconductor layer with a sputtering method, a metal oxide target containing zinc oxide as its main component can be used. As another example of a metal oxide target, a metal oxide target containing In, Ga, and Zn (a composition ratio is $In_2O_3:Ga_2O_3:ZnO=1:1:1$ [molar ratio] or $In_2O_3:Ga_2O_3:ZnO=1:1:2$ [molar ratio]) can be used. Alternatively, as a metal oxide target containing In, Ga, and Zn, a target having a composition ratio of $In_2O_3:Ga_2O_3:ZnO=2:2:1$ [molar ratio] or $In_2O_3:Ga_2O_3:ZnO=1:1:4$ [molar ratio] can be used. The filling rate of the metal oxide target is 90% to 100% inclusive, preferably 95% to 99.9% inclusive. An oxide semiconductor layer which is formed using the metal oxide target with high filling rate is dense.

The oxide semiconductor layer is formed over the substrate 101 in such a manner that a sputtering gas from which hydrogen, water, a hydroxyl group, hydride, or the like is removed is introduced into the treatment chamber and a metal oxide is used as a target while the substrate is kept in the treatment chamber in a reduced-pressure state and moisture remaining in the treatment chamber is removed. It is preferable to use an entrapment vacuum pump in order to remove hydrogen, water, a hydroxyl group, hydride, or the like remaining in the treatment chamber. For example, a cryopump, an ion pump, or a titanium sublimation pump is preferably used. As an evacuation unit, a turbo pump provided with a cold trap may be used. For example, hydrogen, water, a hydroxyl group, hydride, or the like (more preferably, also a compound containing a carbon atom) is removed from the treatment chamber which is evacuated using a cryopump; therefore, the concentration of impurities contained in the oxide semiconductor layer can be reduced. The oxide semiconductor layer may be formed while the substrate is heated.

In this embodiment, as an example of a film formation condition of the oxide semiconductor layer, the following conditions are applied: the substrate temperature is room temperature, the distance between the substrate and the target is 110 mm; the pressure is 0.4 Pa; the power of the direct current (DC) power source is 0.5 kW; and the atmosphere contains oxygen and argon (the oxygen flow rate is 15 sccm, and the argon flow rate is 30 sccm). It is preferable that a pulsed direct-current (DC) power source be used because powder substances (also referred to as particles or dust) generated in deposition can be reduced and the film thickness can be uniform. The oxide semiconductor layer preferably has a thickness of 30 nm to 3000 nm inclusive. Note that an appropriate thickness differs depending on an oxide semiconductor material used, and the thickness may be set as appropriate depending on the material.

Note that the sputtering method used for forming the insulating layer 103 can be used as appropriate as a sputtering method for forming the oxide semiconductor layer.

The conductive layer for forming the second electrode 109 can be formed using the material and the method which are used for the first electrode 105, as appropriate. In addition, the first electrode 105 and the second electrode 109 can be formed of different materials in accordance with the work functions of the materials used and the electron affinity of the oxide semiconductor layer as described in Embodiment 1. Here, a tungsten layer with a thickness of 50 nm, an aluminum layer with a thickness of 100 nm, and a titanium layer with a thickness of 50 nm are sequentially stacked as the conductive layer for forming the second electrode 109.

Next, a resist mask is formed over the conductive layer in a photolithography step, the conductive layer for forming the second electrode 109 and the oxide semiconductor layer for forming the oxide semiconductor layer 107 are etched using the resist mask, whereby the second electrode 109 and the oxide semiconductor layer 107 are formed. Instead of the resist mask formed in the photolithography step, a resist mask is formed using an ink-jet method, so that the number of steps can be reduced. When the angle between the first electrode 105 and the end portions of the second electrode 109 and the oxide semiconductor layer 107 is smaller than 90°, preferably smaller than 80°, more preferably smaller than 70° by the etching, the coverage with the gate insulating layer formed later can be improved.

Note that the etching of the conductive layer and the oxide semiconductor layer here may be performed using either dry etching or wet etching, or using both dry etching and wet etching. In order to form the oxide semiconductor layer 107 and the second electrode 109 each having a desired shape, an etching condition (etchant, etching time, temperature, or the like) is adjusted as appropriate in accordance with a material.

When the etching rate of each of the oxide semiconductor layer and the conductive layer for forming the second electrode 109 is different from that of the first electrode 105, conditions in which the etching rate of the first electrode 105 is low and the etching rate of each of the oxide semiconductor layer and the conductive layer for forming the second electrode 109 is high are selected. Alternatively, a condition in which the etching rate of the oxide semiconductor layer is low and the etching rate of the conductive layer for forming the second electrode 109 is high is selected, the conductive layer for forming the second electrode 109 is etched; then, a condition in which the etching rate of the first electrode 105 is low and the etching rate of the oxide semiconductor layer is high is selected.

As an etchant used for wet etching performed on the oxide semiconductor layer, a solution obtained by mixing phosphoric acid, acetic acid, and nitric acid, an ammonia hydrogen peroxide (hydrogen peroxide at 31 wt %: ammonia water at 28 wt %: water=5:2:2, capacity ratio), or the like can be used. Alternatively, ITO-07N (manufactured by Kanto Chemical Co., Inc.) may be used.

The etchant after the wet etching is removed together with the material etched off by cleaning. The waste liquid including the etchant and the material etched off may be purified and the material may be reused. When a material such as indium contained in the oxide semiconductor layer is collected from the waste liquid after the etching and reused, resources can be effectively used and cost can be reduced.

As the etching gas for dry etching, a gas containing chlorine (chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As a dry etching method, a parallel plate RIE (reactive ion etching) method or an ICP (inductively coupled plasma) etching method can be used. In order to etch the film into a desired shape, the etching condition (the amount of electric power applied to a coil-shaped electrode, the amount of electric power applied to an electrode on a substrate side, the temperature of the electrode on the substrate side, or the like) is adjusted as appropriate.

In this embodiment, the conductive layer for forming the second electrode 109 is etched by a dry etching method, and then, the oxide semiconductor layer is etched with a solution obtained by mixing phosphoric acid, acetic acid, and nitric acid to form the oxide semiconductor layer 107.

Next, in this embodiment, first heat treatment is performed. A temperature of the first heat treatment is 400° C. to 750° C. inclusive, preferably higher than or equal to 400° C. and lower than the strain point of the substrate. Here, the substrate is introduced into an electric furnace that is a kind of heat treatment apparatus and heat treatment is performed on the oxide semiconductor layer in an atmosphere of an inert gas such as nitrogen or a rare gas at 450° C. for one hour, and then, the oxide semiconductor layer is not exposed to the air. Accordingly, hydrogen, water, a hydroxyl group, hydride, or the like can be prevented from entering the oxide semiconductor layer, the hydrogen concentration is reduced, and the purity is increased. As a result, an i-type oxide semiconductor layer or a substantially i-type oxide semiconductor layer can be obtained. That is, at least one of dehydration and dehydrogenation of the oxide semiconductor layer 107 can be performed by this first heat treatment.

Note that it is preferable that in the first heat treatment, hydrogen, water, a hydroxyl group, hydride, or the like be not contained in nitrogen or a rare gas such as helium, neon, or argon. Alternatively, the purity of nitrogen or a rare gas such as helium, neon, or argon introduced into a heat treatment apparatus is 6N (99.9999%) or higher, preferably 7N (99.99999%) or higher (that is, the impurity concentration is 1 ppm or lower, preferably 0.1 ppm or lower).

Further, depending on the condition of the first heat treatment or a material of the oxide semiconductor layer, the oxide semiconductor layer might be crystallized and changed to a microcrystalline film or a polycrystalline film. For example, the oxide semiconductor layer may be crystallized to become a microcrystalline semiconductor layer having a degree of crystallization of 90% or more, or 80% or more. Further, depending on the condition of the first heat treatment or the material of the oxide semiconductor layer, the oxide semiconductor layer may become an amorphous oxide semiconductor layer containing no crystalline component. The oxide semiconductor layer might become an oxide semiconductor layer in which a microcrystalline portion (with a grain diameter of 1 nm to 20 nm inclusive, typically 2 nm to 4 nm inclusive) is mixed in an amorphous oxide semiconductor layer.

The first heat treatment of the oxide semiconductor layer may be performed on the oxide semiconductor layer before being processed into the island-shaped oxide semiconductor layer. In that case, the substrate is taken out of the heat treatment apparatus after the first heat treatment, and then, a photolithography step is performed.

Note that the heat treatment which has an effect of dehydration or dehydrogenation on the oxide semiconductor layer may be performed after the oxide semiconductor layer is formed, after the conductive layer for forming the second electrode is stacked over the oxide semiconductor layer, after the gate insulating layer is formed over the first electrode, the oxide semiconductor layer, and the second electrode, or after the gate electrode is formed.

Figure 11C:
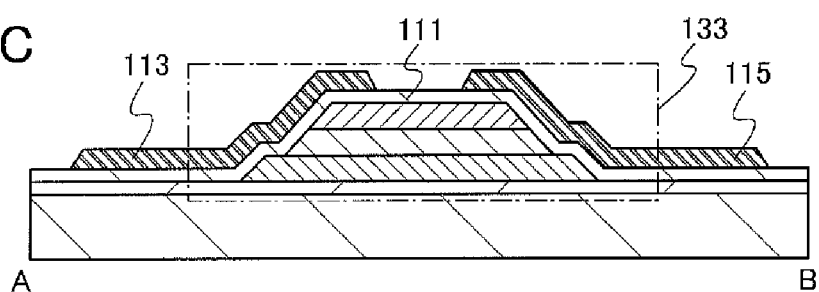

Next, as illustrated in FIG. 11C, the gate insulating layer 111 is formed over the first electrode 105, the oxide semiconductor layer 107, and the second electrode 109.

The i-type oxide semiconductor layer or the substantially i-type oxide semiconductor layer (the highly purified oxide semiconductor layer whose hydrogen concentration is reduced) obtained by the removal of impurities is extremely sensitive to an interface state and interface charge; therefore, the interface between the oxide semiconductor layer and the gate insulating layer 111 is important. Therefore, the gate insulating layer 111 which is in contact with the highly purified oxide semiconductor layer needs high quality.

For example, high-density plasma CVD using a microwave (2.45 GHz) is preferably used, in which case an insulating layer which is dense, has high withstand voltage, and has high quality can be formed. This is because when the highly purified oxide semiconductor layer whose hydrogen concentration is reduced and the high-quality gate insulating layer are in close contact with each other, the interface state can be reduced and the interface characteristics can be favorable.

Needless to say, a different deposition method such as a sputtering method or a plasma CVD method can be used as long as a high-quality insulating layer can be formed as the gate insulating layer. In addition, as the gate insulating layer, an insulating layer whose characteristics of an interface with the oxide semiconductor layer are improved or whose film quality is improved by heat treatment after the formation may be used. In any case, an insulating layer which can reduce the interface state density with the oxide semiconductor layer and can form a favorable interface, in addition to having good film quality as the gate insulating layer, may be used.

In a gate bias-temperature stress test (BT test) at 85° C. at $2 \times 10^6$ V/cm for 12 hours, when impurities are added to the oxide semiconductor layer, bonds between the impurities and main components of the oxide semiconductor layer are cut due to an intense electric field (B: bias) and high temperature (T: temperature), and generated dangling bonds cause a shift in threshold voltage ($V_{th}$).

On the other hand, when impurities of the oxide semiconductor layer, in particular, hydrogen, water, or the like, are removed as much as possible, and characteristics of an interface between the oxide semiconductor layer and the gate insulating layer are improved as described above, a transistor which is stable with respect to the BT test can be obtained.

When the gate insulating layer 111 is formed by a sputtering method, the hydrogen concentration of the gate insulating layer 111 can be reduced. When a silicon oxide film is formed by a sputtering method, a silicon target or a quartz target is used as a target, and oxygen or a mixed gas of oxygen and argon is used as a sputtering gas.

The gate insulating layer 111 can have a structure in which a silicon oxide film and a silicon nitride film are stacked in that order over the first electrode 105, the oxide semiconductor layer 107, and the second electrode 109. A gate insulating layer having a thickness of 100 nm may be formed in such a manner that a silicon oxide film ($SiO_x$ (x>0)) having a thickness of 5 nm to 300 nm inclusive is formed as a first gate insulating layer and then a silicon nitride film ($SiN_y$ (y>0)) having a thickness of 50 nm to 200 nm inclusive is stacked as a second gate insulating layer over the first gate insulating layer by a sputtering method. In this embodiment, a 100-nm-thick silicon oxide film is formed by an RF sputtering method under the condition that the pressure is 0.4 Pa, the power of the high-frequency power source is 1.5 kW, and the atmosphere contains oxygen and argon (the flow ratio of oxygen to argon is 1:1 (each flow rate is 25 sccm)).

Next, second heat treatment may be performed in an inert gas atmosphere or an oxygen gas atmosphere (preferably, at a temperature of 200° C. to 400° C. inclusive, for example, 250° C. to 350° C. inclusive). Note that the second heat treatment may be performed after the formation of the third electrode 113, the third electrode 115, the insulating layer 117, the wiring 125, or the wiring 131, which is performed later. Through this heat treatment, oxygen deficiency in the oxide semiconductor layer which is generated by the first heat treatment is supplied with oxygen in the gate insulating layer or oxygen in the atmosphere for the heat treatment, whereby an oxide semiconductor layer which is more i-type can be obtained.

Then, the third electrode 113 and the third electrode 115 serving as the gate electrode are formed over the gate insulating layer 111.

The third electrodes 113 and 115 can be formed in such a manner that a conductive layer for forming the third electrodes 113 and 115 is formed over the gate insulating layer 111 by a sputtering method, a CVD method, or a vacuum evaporation method, a resist mask is formed over the conductive layer in a photolithography step, and the conductive layer is etched using the resist mask. A material similar to that of the first electrode 105 can be used for the conductive layer for forming the third electrode 113 and the third electrode 115.

In this embodiment, after a titanium layer having a thickness of 150 nm is formed by a sputtering method, etching is performed using a resist mask formed in a photolithography step, so that the third electrode 113 and the third electrode 115 are formed.

Through the above process, the transistor 133 having the highly purified oxide semiconductor layer 107 whose hydrogen concentration is reduced can be formed.

Figure 11D:
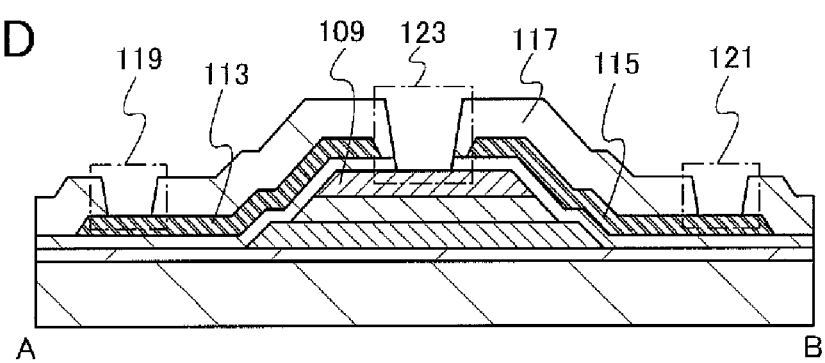

Next, as illustrated in FIG. 11D, after the insulating layer 117 is formed over the gate insulating layer 111, the third electrode 113, and the third electrode 115, a contact hole 119, a contact hole 121, and a contact hole 123 are formed.

The insulating layer 117 is formed using an oxide insulating layer such as a silicon oxide layer, a silicon oxynitride layer, an aluminum oxide layer, or an aluminum oxynitride layer; or a nitride insulating layer such as a silicon nitride layer, a silicon nitride oxide layer, an aluminum nitride layer, or an aluminum nitride oxide layer. Alternatively, an oxide insulating layer and a nitride insulating layer can be stacked.

The insulating layer 117 is formed by a sputtering method, a CVD method, or the like. Note that when the insulating layer 117 is formed by a sputtering method, the substrate 101 may be heated to a temperature of 100° C. to 400° C. inclusive, a sputtering gas which contains high-purity nitrogen, from which hydrogen, water, a hydroxyl group, hydride, or the like is removed may be introduced, and an insulating later may be formed using a silicon target. Also in this case, an insulating layer is preferably formed while hydrogen, water, a hydroxyl group, hydride, or the like remaining in the treatment chamber is removed.

Note that after the insulating layer 117 is formed, heat treatment may be performed in the air at a temperature of 100° C. to 200° C. inclusive for 1 hour to 30 hours inclusive. With this heat treatment, a normally-off transistor can be obtained. Therefore, reliability of the semiconductor device can be improved.

A resist mask is formed in a photolithography step, and parts of the gate insulating layer 111 and the insulating layer 117 are removed by selective etching, whereby the contact hole 119, the contact hole 121, and the contact hole 123 which reach the third electrode 113, the third electrode 115, and the second electrode 109 are formed.

Next, after a conductive layer is formed over the gate insulating layer 111, the insulating layer 117, and the contact holes 119, 121, and 123, etching is performed using a resist mask formed in a photolithography step, whereby the wiring 125 and the wiring 131 (not illustrated in FIG. 11E) are formed. Note that the resist mask may be formed by an ink-jet method. No photomask is used when the resist mask is formed by an ink-jet method; therefore, manufacturing cost can be reduced.

The wirings 125 and 131 can be formed in a manner similar to that of the first electrode 105.

Note that a planarization insulating layer for planarization may be provided between the third electrodes 113 and 115 and the wirings 125 and 131. An organic material having heat resistance, such as polyimide, an acrylic resin, a benzocyclobutene-based resin, polyamide, or an epoxy resin can be used as typical examples of the planarization insulating layer. Other than such organic materials, it is possible to use a low-dielectric constant material (a low-k material), a siloxane-based resin, phosphosilicate glass (PSG), borophosphosilicate glass (BPSG), or the like. Note that the planarization insulating layer may be formed by stacking a plurality of insulating layers formed using any of these materials.

Note that the siloxane-based resin corresponds to a resin containing a Si—O—Si bond formed using a siloxane-based material as a starting material. The siloxane-based resin may include an organic group (e.g., an alkyl group or an aryl group) or a fluoro group as a substituent. Moreover, the organic group may include a fluoro group.

There is no particular limitation on a method for forming the planarization insulating layer. Depending on the material, the planarization insulating layer can be formed by a method such as sputtering method, an SOG method, a spin coating method, a dipping method, a spray coating method, or a droplet discharge method (e.g., an ink-jet method, screen printing, or offset printing), or by using a tool (equipment) such as a doctor knife, a roll coater, a curtain coater, or a knife coater.

As described above, the hydrogen concentration in the oxide semiconductor layer can be reduced, and the oxide semiconductor layer can be highly purified. Accordingly, the oxide semiconductor layer can be stable. In addition, heat treatment at a temperature of lower than or equal to the glass transition temperature makes it possible to form an oxide semiconductor layer with a wide band gap in which the number of minority carriers is extremely small. Thus, transistors can be manufactured using a large-area substrate, which leads to enhancement in mass production. In addition, using the highly purified oxide semiconductor layer whose hydrogen concentration is reduced makes it possible to manufacture a transistor which is suitable for higher definition and has high operation speed and in which a large amount of current can flow in an on state and almost no current flows in an off state.

By electrically connecting one of a source electrode and a drain electrode of such a transistor to a gate electrode thereof, a diode in which reverse current is very small can be obtained. Therefore, according to this embodiment, a diode which is resistant to an avalanche breakdown (i.e., has high withstand voltage) can be manufactured.

Note that a halogen element (e.g. fluorine or chlorine) may be contained in an insulating layer provided in contact with the oxide semiconductor layer, or a halogen element may be contained in the oxide semiconductor layer by plasma treatment in a gas atmosphere containing a halogen element in a state that the oxide semiconductor layer is exposed, whereby impurities such as hydrogen, water, a hydroxyl group, or hydride (also referred to as a hydrogen compound) existing in the oxide semiconductor layer or at the interface between the oxide semiconductor layer and the insulating layer which is provided in contact with the oxide semiconductor layer may be removed. When the insulating layer contains a halogen element, the halogen element concentration in the insulating layer may be $5\times10^{18}$ atoms/cm$^3$ to $1\times10^{20}$ atoms/cm$^3$ inclusive.

As described above, in the case where a halogen element is contained in the oxide semiconductor layer or at the interface between the oxide semiconductor layer and the insulating layer which is in contact with the oxide semiconductor layer and the insulating layer which is provided in contact with the oxide semiconductor layer is an oxide insulating layer, the side of the oxide insulating layer which is not in contact with the oxide semiconductor layer is preferably covered with a nitride insulating layer. That is, a silicon nitride film or the like may be provided on and in contact with the oxide insulating layer which is in contact with the oxide semiconductor layer. With such a structure, impurities such as hydrogen, water, a hydroxyl group, or hydride can be prevented from entering the oxide insulating layer.

Note that the diodes illustrated in FIGS. 2A and 2B, FIGS. 6A to 6D, FIGS. 7A and 7B, FIGS. 8A and 8B, and FIGS. 9A and 9B can also be formed in a manner similar to the above.

This embodiment can be implemented in appropriate combination with the structure described in any of other embodiments.

Embodiment 5

In this embodiment, a diode-connected transistor including an oxide semiconductor layer which is different from that described in Embodiment 4, and a manufacturing method thereof, will be described with reference to FIGS. 11A to 11E and FIGS. 12A and 12B.

In a manner similar to that in Embodiment 4, as illustrated in FIG. 11A, an insulating layer 103 and a first electrode 105 are formed over a substrate 101. Next, as illustrated in FIG. 11B, an oxide semiconductor layer 107 and a second electrode 109 are formed over the first electrode 105.

Figure 12A:
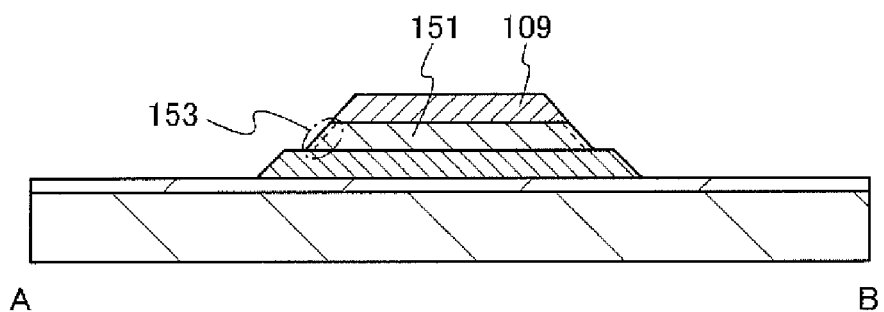
FIGS. 12A and 12B are cross-sectional views illustrating a method for manufacturing a diode according to an embodiment of the present invention.

Next, first heat treatment is performed. The first heat treatment in this embodiment is different from the first heat treatment in the above embodiment. The heat treatment makes it possible to form an oxide semiconductor layer 151 in which crystal grains are formed in the surface as illustrated in FIG. 12A. In this embodiment, the first heat treatment is performed with an apparatus for heating an object to be processed by at least one of thermal conduction and thermal radiation from a heater such as a resistance heater. Here, the temperature of the heat treatment is 500° C. to 700° C. inclusive, preferably 650° C. to 700° C. inclusive. Note that the upper limit of the heat treatment temperature needs to be within the allowable temperature limit of the substrate 101. In addition, the length of time of the heat treatment is preferably 1 minute to 10 minutes inclusive. When RTA treatment is employed for the first heat treatment, the heat treatment can be performed in a short time; thus, adverse effects of heat on the substrate 101 can be reduced. In other words, the upper limit of the heat treatment temperature can be raised in this case as compared with the case where heat treatment is performed for a long time. In addition, the crystal grains having predetermined structures can be selectively formed in the vicinity of the surface of the oxide semiconductor layer.

As examples of the heat treatment apparatus that can be used in this embodiment, rapid thermal anneal (RTA) apparatuses such as a gas rapid thermal anneal (GRTA) apparatus and a lamp rapid thermal anneal (LRTA) apparatus, and the like are given. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the first heat treatment, GRTA may be performed as follows. The substrate is transferred and put in an atmosphere of an inert gas such as nitrogen or a rare gas which has been heated to a high temperature of 650° C. to 700° C. inclusive, heated for several minutes, and transferred and taken out of the inert gas which has been heated to a high temperature. With GRTA, high-temperature heat treatment for a short period of time can be achieved.

Note that it is preferable that in the first heat treatment, hydrogen, water, a hydroxyl group, hydride, or the like be not contained in nitrogen or a rare gas such as helium, neon, or argon. Alternatively, the purity of nitrogen or a rare gas such as helium, neon, or argon introduced into a heat treatment apparatus is 6N (99.9999%) or higher, preferably 7N (99.99999%) or higher (that is, the concentration of the impurities is 1 ppm or lower, preferably 0.1 ppm or lower).

Note that the above heat treatment may be performed at any timing as long as it is performed after the oxide semiconductor layer 107 is formed; however, in order to promote dehydration or dehydrogenation, the heat treatment is preferably performed before other components are formed over a surface of the oxide semiconductor layer 107. In addition, the heat treatment may be performed plural times instead of once.

Figure 12B:
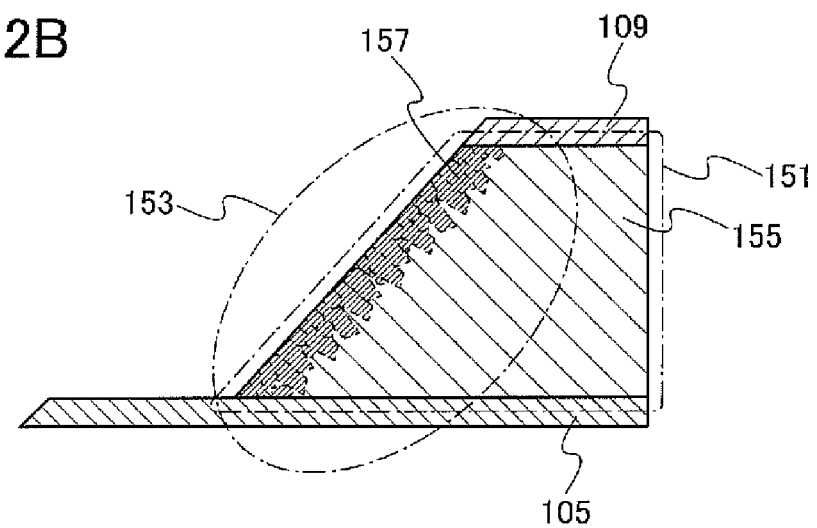

FIG. 12B is an enlarged view of a dashed line portion 153 in FIG. 12A.

The oxide semiconductor layer 151 includes an amorphous region 155 that mainly contains an amorphous oxide semiconductor and crystal grains 157 that are formed in the surface of the oxide semiconductor layer 151. Further, the crystal grains 157 are formed in a region that has a thickness (depth) of about 20 nm in a direction perpendicular to the surface of the oxide semiconductor layer 151 (i.e., in the vicinity of the surface). Note that the location where the crystal grains 157 are formed is not limited to the above in the case where the thickness of the oxide semiconductor layer 151 is large. For example, in the case where the oxide semiconductor layer 151 has a thickness of 200 nm or more, the "vicinity of the surface (surface vicinity)" means a region that has a thickness (depth) in a direction perpendicular to the surface, which is 10% or less of the thickness of the oxide semiconductor layer.

Here, the amorphous region 155 mainly contains an amorphous oxide semiconductor layer. Note that the word "mainly" means, for example, a state where one occupies 50% or more of a region. In this case, it means a state where the amorphous oxide semiconductor layer occupies 50% or more of vol % (or wt %) of the amorphous region 155. That is, the amorphous region in some cases includes crystals of the oxide semiconductor layer other than the amorphous oxide semiconductor layer, and the percentage of the content thereof is preferably lower than 50% of vol % (or wt %). However, the percentage of the content is not limited to the above.

In the case where the In—Ga—Zn—O-based oxide semiconductor is used as a material for the oxide semiconductor layer, the composition of the above amorphous region 155 is preferably set so that a Zn content (at. %) is lower than an In or Ga content (at. %). With such a composition, the crystal grains 157 of a predetermined composition are easily formed.

After that, a gate insulating layer and a third electrode that serves as a gate electrode are formed in a manner similar to that of Embodiment 4 to complete the transistor.

The surface of the oxide semiconductor layer 151, which is in contact with the gate insulating layer, serves as a channel. The crystal grains are included in the region that serves as a channel, whereby the resistance between a source, the channel, and a drain is reduced and carrier mobility is increased. Thus, the field-effect mobility of the transistor which includes the oxide semiconductor layer 151 is increased, which leads to favorable electric characteristics of the transistor.

Further, the crystal grains 157 are more stable than the amorphous region 155; thus, when the crystal grains 157 are included in the vicinity of the surface of the oxide semiconductor layer 151, entry of impurities (e.g., hydrogen, water, a hydroxyl group, or hydride) into the amorphous region 155 can be reduced. Thus, the reliability of the oxide semiconductor layer 151 can be improved.

Through the above process, the concentration of hydrogen in the oxide semiconductor layer can be reduced and the oxide semiconductor layer can be highly purified. Accordingly, the oxide semiconductor layer can be stable. In addition, heat treatment at a temperature of lower than or equal to the glass transition temperature makes it possible to form an oxide semiconductor layer with a wide band gap in which the number of minority carriers is extremely small. Thus, transistors can be manufactured using a large-area substrate, which leads to enhancement in mass production. In addition, using the highly purified oxide semiconductor layer whose hydrogen concentration is reduced makes it possible to manufacture a transistor which is suitable for higher definition and has high operation speed and in which a large amount of current can flow in an on state and almost no current flows in an off state.

By electrically connecting one of a source electrode and a drain electrode of such a transistor to a gate electrode thereof, a diode in which forward current is large and reverse current is small can be manufactured. Therefore, a diode which is resistant to an avalanche breakdown (i.e., has high withstand voltage) can be manufactured.

This embodiment can be implemented in appropriate combination with the structure described in any of other embodiments.

Embodiment 6

In this embodiment, manufacturing steps of the diode-connected transistor illustrated in FIGS. 1A and 1B, which are different from those in Embodiment 4, will be described with reference to FIGS. 11A to 11E.

In a manner similar to that of Embodiment 4, as illustrated in FIG. 11A, the first electrode 105 is formed over the substrate 101.

Next, as illustrated in FIG. 11B, the oxide semiconductor layer 107 and the second electrode 109 are formed over the first electrode 105.

Note that before the oxide semiconductor layer is formed by a sputtering method, reverse sputtering in which plasma is generated with an argon gas introduced is preferably performed to remove dust attached to or an oxide layer formed on the surface of the first electrode 105, so that resistance at the interface between the first electrode 105 and the oxide semiconductor layer can be reduced. Note that instead of an argon atmosphere, a nitrogen atmosphere, a helium atmosphere, or the like may be used.

The oxide semiconductor layer is formed by a sputtering method over the substrate 101 and the first electrode 105. Next, the conductive layer is formed over the oxide semiconductor layer.

In this embodiment, the oxide semiconductor layer is formed by a sputtering method using an In—Ga—Zn—O-based metal oxide target. In this embodiment, the substrate is held in a treatment chamber which is maintained in a reduced pressure state, and the substrate is heated to room temperature or a temperature of lower than 400° C. Then, the oxide semiconductor layer is formed over the substrate 101 and the first electrode 105 in such a manner that a sputtering gas from which hydrogen, water, a hydroxyl group, hydride, or the like is removed is introduced and a metal oxide is used as a target while hydrogen, water, a hydroxyl group, hydride, or the like remaining in the treatment chamber is removed. It is preferable to use an entrapment vacuum pump in order to remove hydrogen, water, a hydroxyl group, hydride, or the like remaining in the treatment chamber. For example, a cryopump, an ion pump, or a titanium sublimation pump is preferably used. As an evacuation unit, a turbo pump provided with a cold trap may be used. From the treatment chamber evacuated with a cryopump, for example, hydrogen, water, a hydroxyl group, hydride (preferably, also a compound containing a carbon atom), or the like is removed; thus, the concentration of impurities contained in the oxide semiconductor layer formed in the treatment chamber can be reduced. Further, by performing sputtering formation while hydrogen, water, a hydroxyl group, hydride, or the like remaining in the treatment chamber is removed with a cryopump, an oxide semiconductor layer in which impurities such as hydrogen atoms and water are reduced can be formed even at a substrate temperature of room temperature to a temperature of lower than 400° C.

In this embodiment, film formation conditions where the distance between the substrate and the target is 100 mm, the pressure is 0.6 Pa, the power of the direct-current (DC) power source is 0.5 kW, and the atmosphere is an oxygen atmosphere (the oxygen flow percentage is 100%) are employed. It is preferable that a pulsed direct-current (DC) power source be used because powder substances (also referred to as particles or dust) generated in film formation can be reduced and the film thickness can be uniform. The oxide semiconductor layer preferably has a thickness of 30 nm to 3000 nm inclusive. Note that an appropriate thickness differs depending on an oxide semiconductor material which is used, and the thickness may be set as appropriate depending on the material.

Note that a sputtering method used for forming the insulating layer 103 can be used as appropriate as a sputtering method for forming the oxide semiconductor layer.

Next, the conductive layer for forming the second electrode 109 is formed using the material and the method that are used for forming the first electrode 105. In addition, the first electrode 105 and the second electrode 109 can be formed of different materials, in accordance with the work functions of the materials used.

Next, in a manner similar to that of Embodiment 4, the conductive layer for forming the second electrode 109 and the oxide semiconductor layer for forming the oxide semiconductor layer 107 are etched, so that the second electrode 109 and the oxide semiconductor layer 107 are formed. In order to form the oxide semiconductor layer 107 and the second electrode 109 each having a desired shape, an etching condition (etchant, etching time, temperature, or the like) is adjusted as appropriate in accordance with a material.

Next, as illustrated in FIG. 11C, in a manner similar to that of Embodiment 4, the gate insulating layer 111 is formed over the first electrode 105, the oxide semiconductor layer 107, and the second electrode 109. As the gate insulating layer 111, an insulating layer that provides a favorable characteristic of an interface between the gate insulating layer 111 and the oxide semiconductor layer 107 is preferable. The gate insulating layer 111 is preferably formed by high-density plasma CVD using a microwave (2.45 GHz), in which case the gate insulating layer 111 can be dense and can have high withstand voltage and high quality. Other deposition methods such as a sputtering method and a plasma CVD method can be used as long as a high-quality insulating layer can be formed as the gate insulating layer.

Note that before the gate insulating layer 111 is formed, reverse sputtering is preferably performed so that resist residues and the like attached to at least a surface of the oxide semiconductor layer 107 are removed.

Further, before the gate insulating layer 111 is formed, hydrogen, water, a hydroxyl group, hydride, or the like attached to an exposed surface of the oxide semiconductor layer may be removed by plasma treatment using a gas such as $N_2O$, $N_2$, or Ar. Plasma treatment may be performed using a mixture gas of oxygen and argon as well. In the case where plasma treatment is performed, the gate insulating layer 111 which is to be in contact with part of the oxide semiconductor layer is preferably formed without being exposed to the air.

Further, it is preferable that the substrate 101 over which components including the first electrode 105 to the second electrode 109 are formed be preheated in a preheating chamber in a sputtering apparatus as pretreatment to eliminate and remove hydrogen, water, a hydroxyl group, hydride, or the like adsorbed onto the substrate 101 so that hydrogen, water, a hydroxyl group, hydride, or the like is contained as little as possible in the gate insulating layer 111. Alternatively, it is preferable that the substrate 101 be preheated in a preheating chamber in a sputtering apparatus to eliminate and remove impurities such as hydrogen, water, a hydroxyl group, hydride, or the like adsorbed onto the substrate 101 after the gate insulating layer 111 is formed. The temperature for the preheating is 100° C. to 400° C. inclusive, preferably 150° C. to 300° C. inclusive. Note that as an evacuation unit provided in the preheating chamber, a cryopump is preferably used. Note also that this preheating treatment can be omitted.

The gate insulating layer 111 can have a structure in which a silicon oxide layer and a silicon nitride layer are stacked in that order over the first electrode 105, the oxide semiconductor layer 107, and the second electrode 109. For example, by a sputtering method, a silicon oxide layer ($SiO_x$ (x>0)) with a thickness of 5 nm to 300 nm inclusive is formed as a first gate insulating layer, and a silicon nitride layer ($SiN_y$ (y>0)) with a thickness of 50 nm to 200 nm inclusive is formed as a second gate insulating layer over the first gate insulating layer, so that the gate insulating layer is formed.

Next, heat treatment (preferably at 200° C. to 400° C. inclusive, for example, 250° C. to 350° C. inclusive) may be performed in an inert gas atmosphere or an oxygen gas atmosphere. Note that the second heat treatment may be performed after the formation of at least one of the third electrode 113, the third electrode 115, the insulating layer 117, the wiring 125, and the wiring 131, which is performed later. Through this heat treatment, oxygen deficiency in the oxide semiconductor layer is supplied with oxygen in the gate insulating layer or oxygen in the atmosphere for the heat treatment, whereby an oxide semiconductor layer which is more i-type can be obtained.

Next, as illustrated in FIG. 11C, in a manner similar to that of Embodiment 4, the third electrode 113 and the third electrode 115 that serve as the gate electrode are formed over the gate insulating layer 111.

Through the above process, the transistor 133 having the oxide semiconductor layer 107 whose hydrogen concentration is reduced can be formed.

Hydrogen, water, a hydroxyl group, hydride, or the like remaining in a reaction atmosphere is removed in forming the oxide semiconductor layer as described above, whereby the concentration of hydrogen in the oxide semiconductor layer can be reduced. Accordingly, the oxide semiconductor layer can be stable.

Next, as illustrated in FIG. 11D, in a manner similar to that of Embodiment 4, the contact hole 119, the contact hole 121, and the contact hole 123 are formed after the insulating layer 117 is formed over the gate insulating layer 111, the third electrode 113, and the third electrode 115.

Figure 11E:
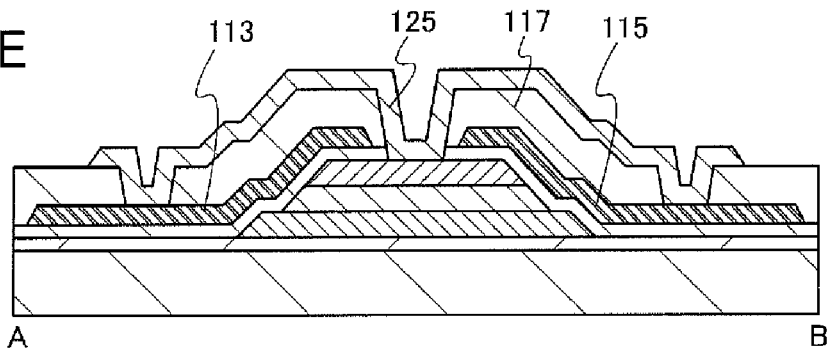

Next, as illustrated in FIG. 11E, in a manner similar to that of Embodiment 4, the wiring 125 and the wiring 131 are formed (not illustrated in FIG. 11E).

Note that in a manner similar to that of Embodiment 4, after the formation of the insulating layer 117, heat treatment may be further performed at a temperature of 100° C. to 200° C.

inclusive in the air for 1 hour to 30 hours inclusive. With this heat treatment, a normally-off transistor can be obtained. Therefore, reliability of the semiconductor device can be improved.

Note that a planarization insulating layer for planarization may be provided between the third electrodes 113 and 115 and the wirings 125 and 131.

Hydrogen, water, a hydroxyl group, hydride, or the like remaining in a reaction atmosphere is removed in forming the oxide semiconductor layer as described above, whereby the concentration of hydrogen in the oxide semiconductor layer can be reduced and the purity of the oxide semiconductor layer can be increased. Accordingly, the oxide semiconductor layer can be stable. In addition, heat treatment at a temperature of lower than or equal to the glass transition temperature makes it possible to form an oxide semiconductor layer with a wide band gap in which the number of minority carriers is extremely small. Thus, transistors can be manufactured using a large-area substrate, which leads to enhancement in mass production. In addition, using the highly purified oxide semiconductor layer whose hydrogen concentration is reduced makes it possible to manufacture a transistor which is suitable for higher definition and has high operation speed and in which a large amount of current can flow in an on state and almost no current flows in an off state.

By electrically connecting one of a source electrode and a drain electrode of such a transistor to a gate electrode thereof, a diode in which reverse current is very small can be obtained. Therefore, according to this embodiment, a diode which is resistant to an avalanche breakdown (i.e., has high withstand voltage) can be manufactured.

This embodiment can be implemented in appropriate combination with the structure described in any of other embodiments.

Embodiment 7

The diode which is described in the above embodiment can be applied to a semiconductor device. As the semiconductor device, for example, a display device can be given.

Figure 13:
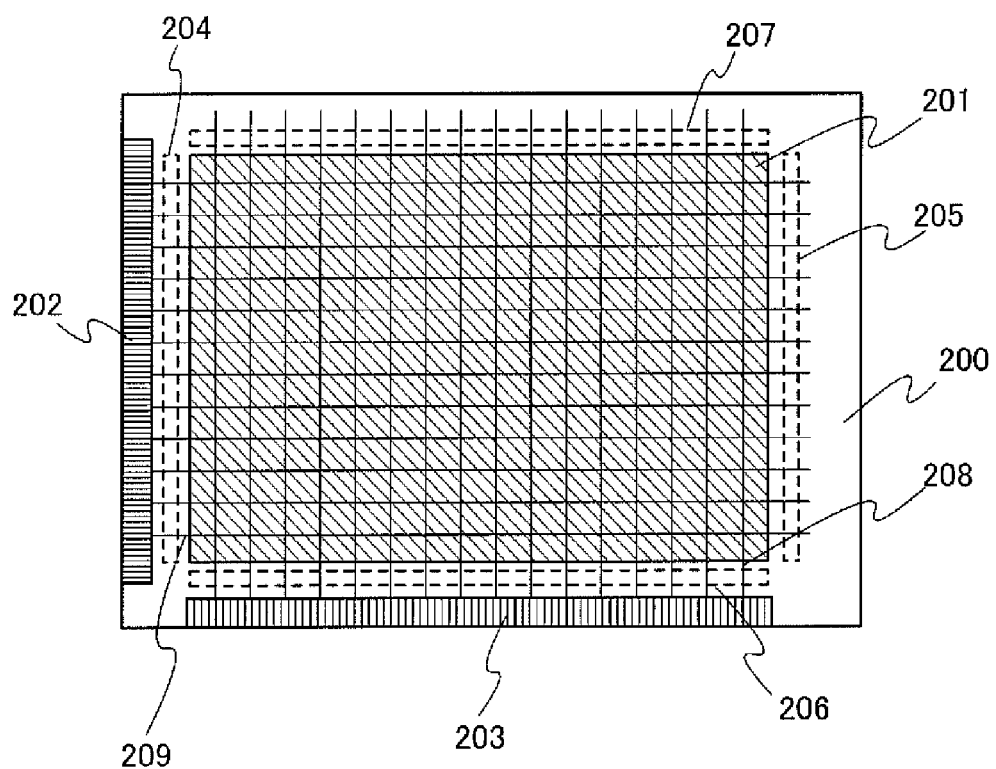
FIG. 13 is a diagram illustrating a display device according to an embodiment of the present invention.

The structure of a display device which is an embodiment of the present invention is described with reference to FIG. 13. FIG. 13 is a top view of a substrate 200 over which the display device is formed. A pixel portion 201 is formed over the substrate 200. In addition, an input terminal 202 and an input terminal 203 supply a signal and power for displaying images to a pixel circuit formed over the substrate 200.

Note that the display device according to an embodiment of the present invention is not limited to that illustrated in FIG. 13. That is, one of or both a scan line driver circuit and a signal line driver circuit may be formed over the substrate 200.

The input terminal 202 on the scan line side and the input terminal 203 on the signal line side which are formed over the substrate 200 are connected to the pixel portion 201 by wirings extended vertically and horizontally. The wirings are connected to protection circuits 204 to 207.

The pixel portion 201 and the input terminal 202 are connected by a wiring 209. The protection circuit 204 is placed between the pixel portion 201 and the input terminal 202 and is connected to the wiring 209. When the protection circuit 204 is provided, various semiconductor elements such as transistors, which are included in the pixel portion 201, can be protected and deterioration or damage thereof can be prevented. Note that although the wiring 209 corresponds to one wiring in the drawing, all of a plurality of wirings provided in parallel with the wiring 209 have connection relations which are similar to that of the wiring 209. Note that the wiring 209 serves as a scan line.

Note that on the scan line side, not only the protection circuit 204 between the input terminal 202 and the pixel portion 201 but also a protection circuit on the side of the pixel portion 201 which is opposite to the input terminal 202 may be provided (see the protection circuit 205 in FIG. 13).

Meanwhile, the pixel portion 201 and the input terminal 203 are connected by a wiring 208. The protection circuit 206 is placed between the pixel portion 201 and the input terminal 203 and is connected to the wiring 208. When the protection circuit 206 is provided, various semiconductor elements such as transistors, which are included in the pixel portion 201, can be protected and deterioration or damage thereof can be prevented. Note that although the wiring 208 corresponds to one wiring in the drawing, all of a plurality of wirings provided in parallel with the wiring 208 have connection relations which are similar to that of the wiring 208. Note that the wiring 208 serves as a signal line.

Note that on the signal line side, not only the protection circuit 206 between the input terminal 203 and the pixel portion 201 but also a protection circuit on the side of the pixel portion 201 which is opposite to the input terminal 203 may be provided (see the protection circuit 207 in FIG. 13).

Note that all the protection circuits 204 to 207 are not necessarily provided. However, it is necessary to provide at least the protection circuit 204. This is because when excessive current is generated in the scan line, gate insulating layers of the transistors included in the pixel portion 201 are broken and a number of point defects can be generated.

In addition, when not only the protection circuit 204 but also the protection circuit 206 is provided, generation of excessive current in the signal line can be prevented. Therefore, as compared with the case where only the protection circuit 204 is provided, reliability is improved and yield is improved. When the protection circuit 206 is provided, breakdown due to static electricity which can be generated in a rubbing process or the like after forming the transistors can be prevented.

Further, when the protection circuit 205 and the protection circuit 207 are provided, reliability can be further improved. Moreover, yield can be improved. The protection circuit 205 and the protection circuit 207 are provided opposite to the input terminal 202 and the input terminal 203, respectively. Therefore, the protection circuit 205 and the protection circuit 207 can prevent deterioration and breakdown of various semiconductor elements, which are caused in a manufacturing step of the display device (e.g., a rubbing process in manufacturing a liquid crystal display device).

Note that in FIG. 13, a signal line driver circuit and a scan line driver circuit which are formed separately from the substrate 200 are mounted on the substrate 200 by a known method such as a COG method or a TAB method. However, the present invention is not limited thereto. The scan line driver circuit and the pixel portion may be formed over the substrate 200, and the signal line driver circuit which is formed separately may be mounted. Alternatively, part of the scan line driver circuit or part of the signal line driver circuit, and the pixel portion 201 may be formed over the substrate 200, and the other part of the scan line driver circuit or the other part of the signal line driver circuit may be mounted. When part of the scan line driver circuit is provided between the pixel portion 201 and the input terminal 202 on the scan line side, a protection circuit may be provided between the input terminal 202 on the scan line side and part of the scan line driver circuit over the substrate 200; a protection circuit may be provided between part of the scan line driver circuit and the pixel portion 201; or protection circuits may be provided between the input terminal 202 on the scan line side and part of the scan line driver circuit over the substrate 200 and between part of the scan line driver circuit and the pixel portion 201. Alternatively, when part of the signal line driver circuit is provided between the pixel portion 201 and the input terminal 203 on the signal line side, a protection circuit may be provided between the input terminal 203 on the signal line side and part of the signal line driver circuit over the substrate 200; a protection circuit may be provided between part of the signal line driver circuit and the pixel portion 201; or protection circuits may be provided between the input terminal 203 on the signal line side and part of the signal line driver circuit over the substrate 200 and between part of the signal line driver circuit and the pixel portion 201. That is, since various modes are used for driver circuits, the number and the positions of protection circuits are determined in accordance with modes of the driver circuits.

Next, examples of a specific circuit structure of a protection circuit which is used as the protection circuits 204 to 207 in FIG. 13 are described with reference to FIGS. 14A to 14F. Only the case where an n-channel transistor is provided is described below.

Figure 14A:
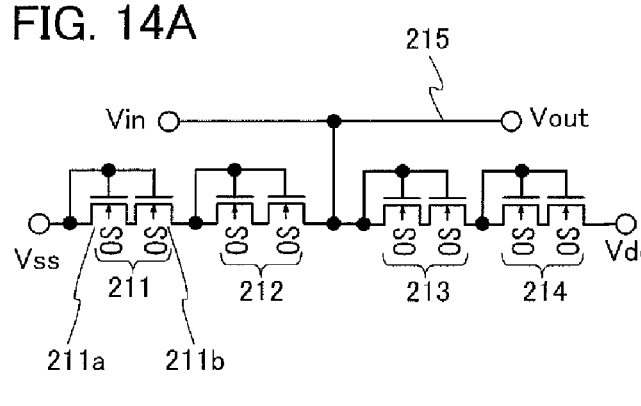
FIGS. 14A to 14F are diagrams each illustrating a protection circuit according to an embodiment of the present invention.

A protection circuit illustrated in FIG. 14A includes protection diodes 211 to 214 each including a plurality of transistors. The protection diode 211 includes an n-channel transistor 211a and an n-channel transistor 211b which include oxide semiconductors (OS) and are connected in series. One of a source electrode and a drain electrode of the n-channel transistor 211a is connected to a gate electrode of the n-channel transistor 211a and a gate electrode of the n-channel transistor 211b and is kept at a potential $V_{ss}$. The other of the source electrode and the drain electrode of the n-channel transistor 211a is connected to one of a source electrode and a drain electrode of the n-channel transistor 211b. The other of the source electrode and the drain electrode of the n-channel transistor 211b is connected to the protection diode 212. Further, in a manner similar to that of the protection diode 211, the protection diodes 212 to 214 each include a plurality of transistors connected in series, and one end of the plurality of transistors connected in series is connected to gate electrodes of the plurality of transistors.

Note that the number and the polarity of the transistors included in the protection diodes 211 to 214 are not limited to those illustrated in FIG. 14A. For example, the protection diode 211 may be formed using three transistors connected in series.

The protection diodes 211 to 214 are sequentially connected in series, and a wiring 215 is connected between the protection diode 212 and the protection diode 213. Note that the wiring 215 is a wiring electrically connected to a semiconductor element which is to be protected. Note that a wiring connected to the wiring 215 is not limited to a wiring between the protection diode 212 and the protection diode 213. That is, the wiring 215 may be connected between the protection diode 211 and the protection diode 212, or may be connected between the protection diode 213 and the protection diode 214.

One end of the protection diode 214 is kept at a power supply potential $V_{dd}$. In addition, each of the protection diodes 211 to 214 is connected so that reverse bias voltage is applied to each of the protection diodes 211 to 214.

Figure 14B:
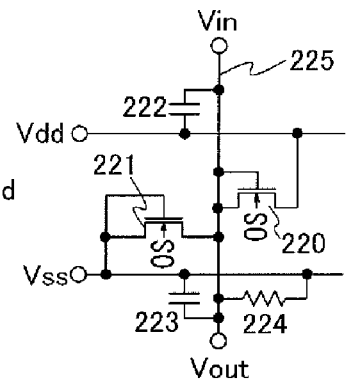

A protection circuit illustrated in FIG. 14B includes a protection diode 220, a protection diode 221, a capacitor 222, a capacitor 223, and a resistor 224. The resistor 224 is a resistor having two terminals. A potential $V_{in}$ is supplied to one of the terminals of the resistor 224 from a wiring 225. A potential $V_{ss}$ is supplied to the other of the terminals of the resistor 224. The resistor 224 is provided in order to make the potential of the wiring 225 $V_{ss}$ when the potential $V_{in}$ is not supplied, and the resistance value of the resistor 224 is set so as to be sufficiently higher than the wiring resistance of the wiring 225. Diode-connected n-channel transistors are used for the protection diode 220 and the protection diode 221.

Note that the protection diodes illustrated in FIGS. 14A to 14F may be configured with two or more transistors connected in series.

Here, the case where the protection circuits illustrated in FIGS. 14A to 14F are operated is described. At this time, in each of the protection diodes 211, 212, 221, 230, 231, 234, and 235, one of a source electrode and a drain electrode which is kept at the potential $V_{ss}$ is a drain electrode, and the other is a source electrode. In each of the protection diodes 213, 214, 220, 232, 233, 236, and 237, one of a source electrode and a drain electrode which is kept at the potential $V_{dd}$ is a source electrode, and the other is a drain electrode. In addition, the threshold voltage of the transistors included in the protection diodes is denoted by $V_{th}$.

Further, as for the protection diodes 211, 212, 221, 230, 231, 234, and 235, when the potential $V_{in}$ is higher than the potential $V_{ss}$, reverse bias voltage is applied thereto and current does not easily flow therethrough. Meanwhile, as for the protection diodes 213, 214, 220, 232, 233, 236, and 237, when the potential $V_{in}$ is lower than the potential $V_{dd}$, reverse bias voltage is applied thereto and current does not easily flow therethrough.

Here, operations of the protection circuits in which a potential $V_{out}$ is set substantially between the potential $V_{ss}$ and the potential $V_{dd}$ are described.

First, the case where the potential $V_{in}$ is higher than the potential $V_{dd}$ is described. When the potential $V_{in}$ is higher than the potential $V_{dd}$, the n-channel transistors are turned on when a potential difference between the gate electrodes and the source electrodes of the protection diodes 213, 214, 220, 232, 233, 236, and 237 is $V_{gs}=V_{in}-V_{dd}>V_{th}$. Here, since the case where $V_{in}$ is unusually high is assumed, the n-channel transistors are turned on. At this time, the n-channel transistors included in the protection diodes 211, 212, 221, 230, 231, 234, and 235 are turned off. Then, the potentials of the wirings 215, 225, 239A, and 239B become $V_{dd}$ through the protection diodes 213, 214, 220, 232, 233, 236, and 237. Therefore, even when the potential $V_{in}$ is unusually higher than the potential $V_{dd}$ due to noise or the like, the potentials of the wirings 215, 225, 239A, and 239B do not become higher than the potential $V_{dd}$.

On the other hand, when the potential $V_{in}$ is lower than the potential $V_{ss}$, the n-channel transistors are turned on when a potential difference between the gate electrodes and the source electrodes of the protection diodes 211, 212, 221, 230, 231, 234, and 235 is $V_{gs}=V_{ss}-V_{in}>V_{th}$. Here, since the case where $V_{in}$ is unusually low is assumed, the n-channel transistors are turned on. At this time, the n-channel transistors included in the protection diodes 213, 214, 220, 232, 233, 236, and 237 are turned off. Then, the potentials of the wirings 215, 225, 239A, and 239B become $V_{ss}$ through the protection diodes 211, 212, 221, 230, 231, 234, and 235. Therefore, even when the potential $V_{in}$ is unusually lower than the potential $V_{ss}$ due to noise or the like, the potentials of the wirings 215, 225, 239A, and 239B do not become lower than the potential $V_{ss}$. Further, the capacitor 222 and the capacitor 223 reduce pulsed noise of the input potential $V_{in}$ and relieve a steep change in potential due to noise.

Note that when the potential $V_{in}$ is between $V_{ss}-V_{th}$ and $V_{dd}+V_{th}$, all the n-channel transistors included in the protection diodes are turned off, and the potential $V_{in}$ is input to the potential $V_{out}$.

When the protection circuits are provided as described above, the potentials of the wirings 215, 225, 239A, and 239B are each kept substantially between the potential $V_{ss}$ and the potential $V_{dd}$. Therefore, the potentials of the wirings 215, 225, 239A, and 239B can be prevented from deviating from this range greatly. That is, the potentials of the wirings 215, 225, 239A, and 239B can be prevented from being unusually high or being unusually low, a circuit in the subsequent stage of the protection circuits can be prevented from being damaged or deteriorating, and the circuit in the subsequent stage can be protected.

Further, as illustrated in FIG. 14B, when the protection circuit including the resistor 224 is provided for an input terminal, potentials of all the wirings supplied with a signal can be kept constant (here the potential $V_{ss}$) when a signal is not input. That is, when a signal is not input, the protection circuit also has a function of a short-circuit ring capable of short-circuiting the wirings. Therefore, electrostatic discharge damage caused by a potential difference between the wirings can be prevented. In addition, since the resistance of the resistor 224 is sufficiently higher than wiring resistance, a signal input to the wiring can be prevented from dropping to the potential $V_{ss}$ at the time of inputting the signal.

Here, as an example, the case is described in which n-channel transistors having the threshold voltage $V_{th}=0$ are used for the protection diode 220 and the protection diode 221 in FIG. 14B.

First, in the case of $V_{in}>V_{dd}$, the n-channel transistor included in the protection diode 220 is turned on because $V_{gs}=V_{in}-V_{dd}>0$. In addition, the n-channel transistor included in the protection diode 221 is turned off. Therefore, the potential of the wiring 225 becomes $V_{dd}$, so that $V_{out}=V_{dd}$.

On the other hand, in the case of $V_{in}<V_{ss}$, the n-channel transistor included in the protection diode 220 is turned off. The n-channel transistor included in the protection diode 221 is turned on because $V_{gs}=V_{ss}-V_{in}>0$. Therefore, the potential of the wiring 225 becomes $V_{ss}$, so that $V_{out}=V_{ss}$.

Even in the case of $V_{in}<V_{ss}$ or $V_{dd}<V_{in}$ in this manner, operations can be performed in a range of $V_{ss}<V_{out}<V_{dd}$. Therefore, even in the case where $V_{in}$ is too high or too low, $V_{out}$ can be prevented from being too high or too low. Accordingly, for example, even when the potential $V_{in}$ is lower than the potential $V_{ss}$ due to noise or the like, the potential of the wiring 225 does not become extremely lower than the potential $V_{ss}$. Further, the capacitor 222 and the capacitor 223 reduce pulsed noise of the input potential $V_{in}$ and relieve a steep change in potential.

When the protection circuit is provided as described above, the potential of the wiring 225 is kept substantially between the potential $V_{ss}$ and the potential $V_{dd}$. Therefore, the potential of the wiring 225 can be prevented from deviating from this range greatly, and a circuit in the subsequent stage of the protection circuit (a circuit, an input portion of which is electrically connected to $V_{out}$) can be protected from being broken or deteriorating. Further, when a protection circuit is provided for an input terminal, potentials of all the wirings to which a signal is input can be kept constant (here the potential $V_{ss}$) when a signal is not input. That is, when a signal is not input, the protection circuit also has a function of a short-circuit ring capable of short-circuiting the wirings. Therefore, electrostatic discharge damage caused by a potential difference between the wirings can be prevented. In addition, since the resistance value of the resistor 224 is sufficiently high, decrease in potential of a signal input to the wiring 225 can be prevented at the time of inputting the signal.

Figure 14C:
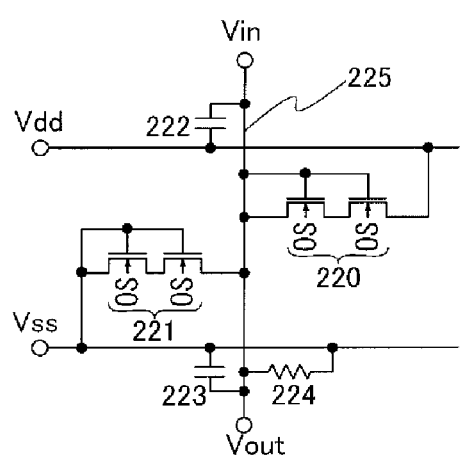

The protection circuit illustrated in FIG. 14C is a protection circuit in which two n-channel transistors are used for each of the protection diode 220 and the protection diode 221.

Note that although diode-connected n-channel transistors are used for the protection diodes in the protection circuits illustrated in FIGS. 14B and 14C, the present invention is not limited to this structure.

Figure 14D:
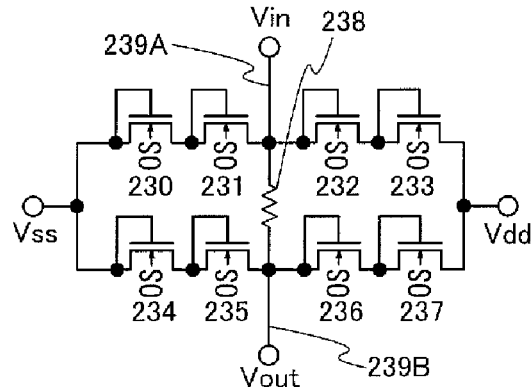

The protection circuit illustrated in FIG. 14D includes protection diodes 230 to 237 and a resistor 238. The resistor 238 is connected between the wiring 239A and the wiring 239B in series. A diode-connected n-channel transistor is used for each of the protection diodes 230 to 233. In addition, a diode-connected n-channel transistor is used for each of the protection diodes 234 to 237.

The protection diode 230 and the protection diode 231 are connected in series, one end thereof is kept at the potential $V_{ss}$, and the other end thereof is connected to the wiring 239A of the potential $V_{in}$. The protection diode 232 and the protection diode 233 are connected in series, one end thereof is kept at the potential $V_{dd}$, and the other end thereof is connected to the wiring 239A of the potential $V_{in}$. The protection diode 234 and the protection diode 235 are connected in series, one end thereof is kept at the potential $V_{ss}$, and the other end thereof is connected to the wiring 239B of the potential $V_{out}$. The protection diode 236 and the protection diode 237 are connected in series, one end thereof is kept at the potential $V_{dd}$, and the other end thereof is connected to the wiring 239B of the potential $V_{out}$.

Figure 14E:
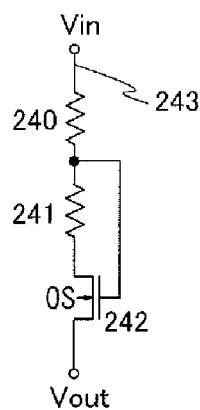

The protection circuit illustrated in FIG. 14E includes a resistor 240, a resistor 241, and a protection diode 242. Although a diode-connected n-channel transistor is used for the protection diode 242 in FIG. 14E, the present invention is not limited to this structure. A plurality of diode-connected transistors may be used. The resistor 240, the resistor 241, and the protection diode 242 are connected to a wiring 243 in series.

The resistor 240 and the resistor 241 can relieve a steep change in the potential of the wiring 243 and can prevent deterioration or breakdown of a semiconductor element. Further, the protection diode 242 can prevent reverse bias current from flowing through the wiring 243 due to the change in potential.

Figure 14F:
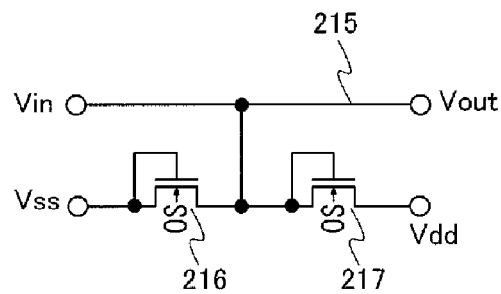

Note that the structure of the protection circuit illustrated in FIG. 14A can be replaced with the structure illustrated in FIG. 14F. FIG. 14F illustrates a structure in which the protection diode 211 and the protection diode 212 in FIG. 14A are replaced with the protection diode 216, and the protection diode 213 and the protection diode 214 are replaced with the protection diode 217. In particular, since the diode which is described in the above embodiment has high withstand voltage, the structure as illustrated in FIG. 14F can be used.

Note that when only the resistors are connected to the wiring in series, a steep change in the potential of the wiring can be relieved, and deterioration or breakdown of a semiconductor element can be prevented. Further, when only the protection diodes are connected to the wiring in series, a reverse current can be prevented from flowing through the wiring due to a change in potential.

Note that the protection circuit provided in a display device according to an embodiment of the present invention is not limited to the structures illustrated in FIGS. 14A to 14F, and design of the protection circuit can be changed as appropriate as long as the protection circuit has a circuit structure having a similar function.

Embodiment 8

In this embodiment, an example of a structure of a semiconductor device which includes the diode described in the above embodiment and can supply electric power stably will be described with reference to FIGS. 15A and 15B. When a voltage that is higher than an expected voltage is applied to a power supply line, a circuit connected to the power supply line could be damaged. Although the example of the structure for mainly protecting a signal line from an excessive voltage that is higher than an expected voltage is described in the above embodiment, FIGS. 15A and 15B illustrate an example of a structure for preventing application of an excessive voltage that is higher than an expected voltage to a power supply line.

Figure 15A:
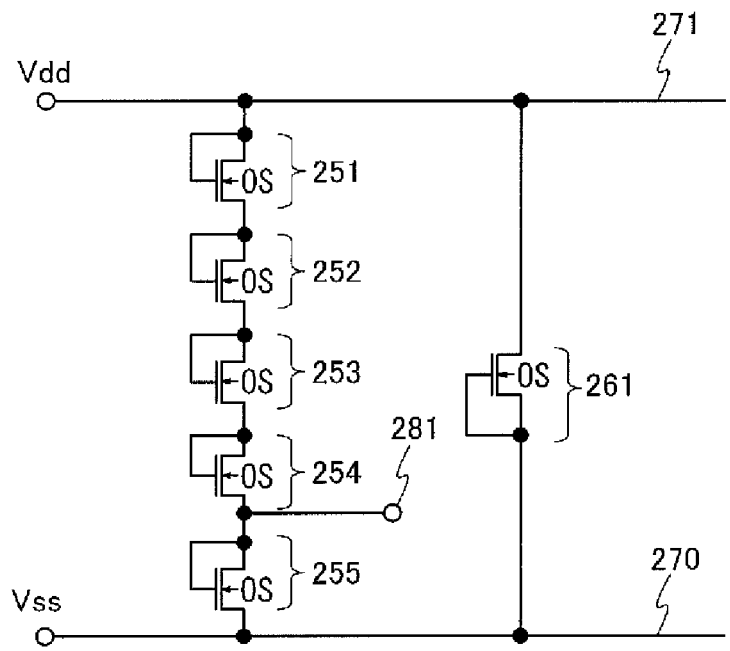
FIGS. 15A and 15B are diagrams each illustrating a protection circuit according to an embodiment of the present invention.

FIG. 15A is a circuit diagram illustrating a state in which a protection diode 251 to a protection diode 255 and a protection diode 261 each using an n-channel transistor including an oxide semiconductor (OS) are connected between a power supply line 270 which supplies a potential $V_{ss}$ and a power supply line 271 which supplies a potential $V_{dd}$. In addition, in FIG. 15B, the structure of the protection diode with the use of the transistor which is illustrated in FIG. 15A is indicated by a circuit symbol of a diode.

As an example, the case where the potential $V_{ss}$ is set to 0 V, the potential $V_{dd}$ is set to 10 V, and a potential difference between the power supply line 270 and the power supply line 271 does not exceed 10 V is described. In this embodiment, as the protection diode, an n-channel transistor whose threshold voltage ($V_{th}$) is 2 V is used.

Figure 15B:
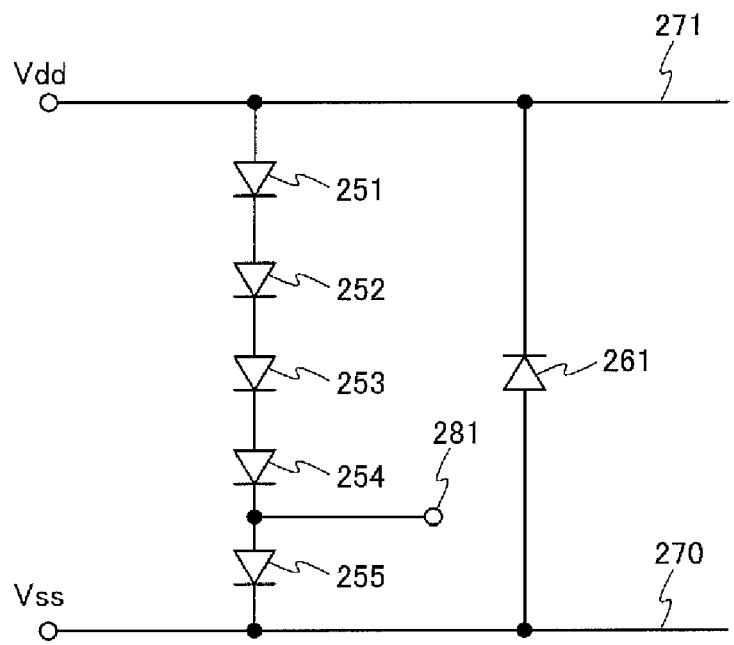

In FIGS. 15A and 15B, the anode side of the protection diode 251 is connected to the power supply line 271 which supplies the potential $V_{dd}$. The protection diode 251 is formed using an n-channel transistor including an oxide semiconductor (OS). One of a source electrode and a drain electrode of the n-channel transistor is connected to the power supply line 271 and a gate electrode of the n-channel transistor and serves as an anode. The other of the source electrode and the drain electrode serves as a cathode and is connected to an anode of the protection diode 252.

The protection diode 252 is formed using an n-channel transistor including an oxide semiconductor (OS). One of a source electrode and a drain electrode of the n-channel transistor is connected to the cathode of the protection diode 251 and a gate electrode of the n-channel transistor and serves as an anode. The other of the source electrode and the drain electrode serves as a cathode and is connected to an anode of the protection diode 253.

In this manner, the protection diode 251 to the protection diode 255 are connected in series, and a cathode of the protection diode 255 is connected to the power supply line 270 which supplies the potential $V_{ss}$. That is, five protection diodes are connected in series in a forward bias direction between the power supply line 270 and the power supply line 271.

In general, when voltage is applied in a forward bias direction, forward current flows through a diode and a conduction state is made between an anode and a cathode. In this embodiment, five diodes each formed using an n-channel transistor whose threshold voltage ($V_{th}$) is 2 V are connected in series; therefore, unless forward bias exceeds 10 V which is five times 2 V, a conduction state is not made between the power supply line 270 and the power supply line 271. However, when a potential difference between the power supply line 270 and the power supply line 271 exceeds 10 V due to noise or the like, the protection diode 251 to the protection diode 255 are placed in a conduction state, and the power supply line 270 and the power supply line 271 are short-circuited until the potential difference drops to 10 V or lower. In such a manner, a voltage that is higher than an expected voltage is applied to a circuit through the power supply lines, which can prevent damage of the circuit.

In addition, by connecting the protection diode 261 between the power supply line 270 and the power supply line 271 such that reverse bias is applied to the protection diode 261, when the potential of the power supply line 270 is higher than that of the power supply line 271 due to noise or the like, electric charge can be released by short-circuiting the power supply line 270 and the power supply line 271, whereby a circuit connected to the power supply lines can be prevented from being damaged.

The protection diode 261 is formed using a transistor including an oxide semiconductor (OS) and is a diode which is resistant to a breakdown and has high withstand voltage even when large reverse bias is applied. In this embodiment, an example is described in which one protection diode 261 is provided between the power supply line 270 and the power supply line 271. However, a plurality of the protection diodes 261 may be provided in series. By providing n protection diodes 261 in series, voltage applied to one protection diode can be one n-th, so that the plurality of diodes provided in series can serves as one diode which has a more excellent resistance.

In addition, a plurality of sets of the protection diode 251 to the protection diode 255 connected in series and the protection diode 261 may be provided between the power supply line 270 and the power supply line 271 in parallel. By providing a plurality of the above sets in parallel, a larger amount of current can flow, so that the potential between the power supply line 270 and the power supply line 271 can be stabilized more rapidly.

When a terminal 281 is provided between the protection diode 254 and the protection diode 255, a voltage corresponding to the threshold voltage ($V_{th}$) of the protection diode 255 can be taken out. In this embodiment, since the threshold voltage ($V_{th}$) of the protection diode 255 is set to 2 V, the terminal 281 can be used as a power supply line of 2 V. Further, by providing the terminal 281 between the protection diode 253 and the protection diode 252, the terminal 281 can be used as a power supply line of 6 V. Adjusting the threshold voltage ($V_{th}$) of the protection diode 255 and the number of protection diodes connected in series enables a predetermined potential to be taken out.

Embodiment 9

The display device including the protection circuit described in Embodiment 7 can be applied to an electronic device.

As examples of the electronic device in which the display device of Embodiment 7 is applied to a display portion, the following can be given: cameras such as video cameras and digital cameras, goggle type displays, navigation systems, audio replay devices (e.g., car audio systems and audio systems), computers, game machines, portable information terminals (e.g., mobile computers, mobile phones, portable game machines, and electronic book readers), image replay devices in which a recording medium is provided (specifically, devices that are capable of replaying recording media such as digital versatile discs (DVDs) and equipped with a display that can display an image), and the like.

Figure 16A:
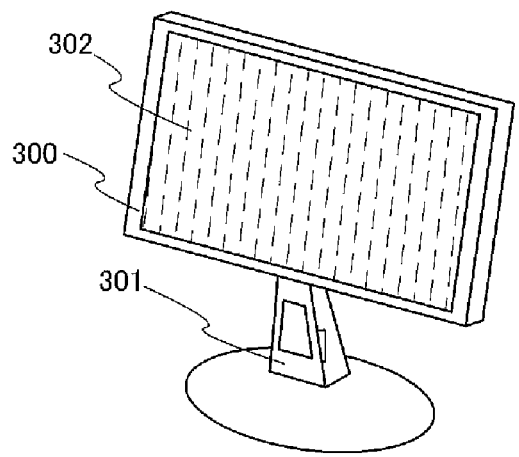
FIGS. 16A to 16C are diagrams each illustrating an electronic device according to an embodiment of the present invention.

A display illustrated in FIG. 16A includes a housing 300, a support 301, and a display portion 302, and has a function of displaying a variety of input information (e.g., still images, moving images, and text images) on the display portion 302.

Note that the function of the display illustrated in FIG. 16A is not limited to this, and for example, the display can be provided with a speaker, or the display may be a touch panel through which information can be not only displayed but input.

Figure 16B:
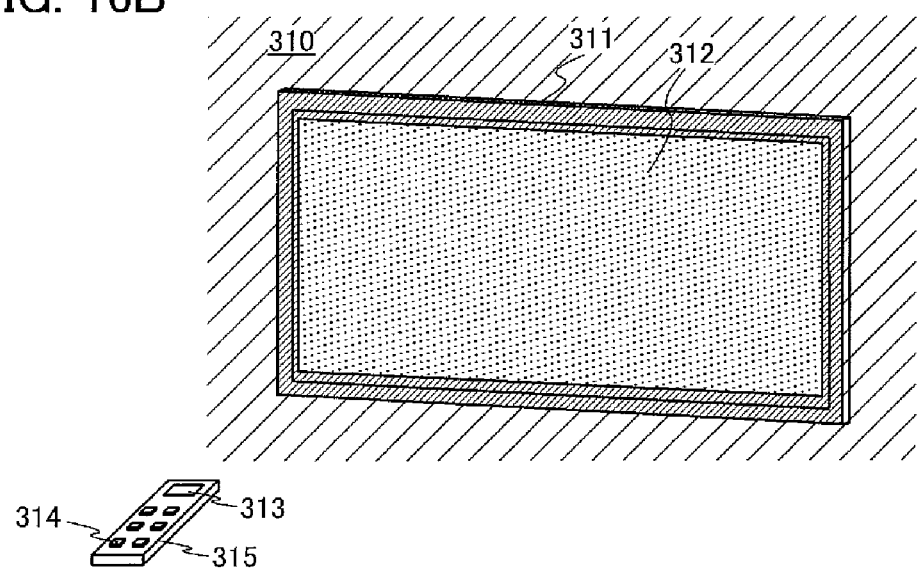

In a television set illustrated in FIG. 16B, a display portion 312 is incorporated in a housing 311. The display portion 312 can display images. Here, the structure in which the rear side of the housing is supported by fixing to a wall 310 is illustrated.

The television set illustrated in FIG. 16B can be operated with an operation switch of the housing 311 or a remote controller 315. Channels and volume can be controlled by an operation key 314 of the remote controller 315 so that an image displayed on the display portion 312 can be controlled. Further, the remote controller 315 may be provided with a display portion 313 for displaying data output from the remote controller 315.

Note that the television set illustrated in FIG. 16B may be provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 16C:
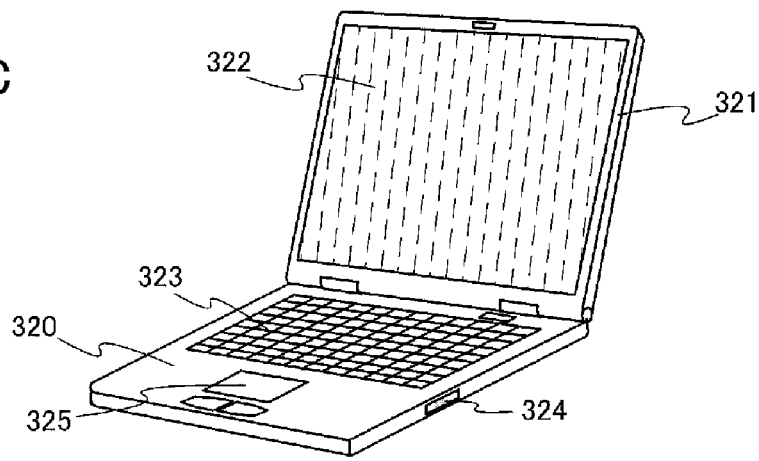

A computer illustrated in FIG. 16C includes a main body 320, a housing 321, a display portion 322, a keyboard 323, an external connection port 324, and a pointing device 325, and has a function of displaying a variety of information (e.g., still images, moving images, and text images) on the display portion 322. Note that the function of the computer illustrated in FIG. 16C is not limited to this, and for example, may have a function of a touch panel capable of inputting information as well as displaying information.

As described in this embodiment, a diode which is an embodiment of the present invention can be applied to the electronic device.

This application is based on Japanese Patent Application serial no. 2009-270800 filed with Japan Patent Office on Nov. 27, 2009, the entire contents of which are hereby incorporated by reference.

EXPLANATION OF REFERENCE

101: substrate, 103: insulating layer, 105: electrode, 106: electrode, 107: oxide semiconductor layer, 109: electrode, 111: gate insulating layer, 113: electrode, 115: electrode, 117: insulating layer, 119: contact hole, 121: contact hole, 123: contact hole, 125 wiring, 129: wiring, 131: wiring, 132: wiring, 133: transistor, 141: transistor, 143: transistor, 145: transistor

The invention claimed is:

1. A non-linear element comprising:
a source electrode;
an oxide semiconductor layer adjacent to the source electrode;
a drain electrode adjacent to the oxide semiconductor layer, wherein the oxide semiconductor layer is interposed between the source electrode and the drain electrode so that a current flows through the oxide semiconductor layer in a thickness direction thereof;
a gate insulating layer over the source electrode, the oxide semiconductor layer, and the drain electrode; and
a plurality of gate electrodes adjacent to the oxide semiconductor layer with the gate insulating layer interposed therebetween, the plurality of gate electrodes being in contact with the gate insulating layer,
wherein the plurality of gate electrodes are electrically connected to the drain electrode; and
wherein an area of contact between the source electrode and the oxide semiconductor layer is different from an area of contact between the drain electrode and the oxide semiconductor layer.

2. The non-linear element according to claim 1, wherein the area of contact between the drain electrode and the oxide semiconductor layer is larger than the area of contact between the source electrode and the oxide semiconductor layer.

3. The non-linear element according to claim 1, wherein the area of contact between the drain electrode and the oxide semiconductor layer is less than the area of contact between the source electrode and the oxide semiconductor layer.

4. The non-linear element according to claim 1,
wherein carrier density of the oxide semiconductor layer is lower than $1 \times 10^{12}/cm^3$.

5. The non-linear element according to claim 1,
wherein at least a portion of the gate insulating layer which is contact with the oxide semiconductor layer comprises an oxide insulating layer.

6. The non-linear element according to claim 1, further comprising a nitride insulating layer on and in contact with the gate insulating layer.

7. A display device comprising a protection circuit including the non-linear element according to claim 1.

8. An electronic device comprising the display device according to claim 7.

9. A non-linear element comprising:
a first electrode;
an oxide semiconductor layer on and in contact with the first electrode;
a second electrode on and in contact with the oxide semiconductor layer;
a gate insulating layer over the first electrode, the oxide semiconductor layer, and the second electrode; and
a plurality of third electrodes adjacent to the oxide semiconductor layer with the gate insulating layer interposed therebetween, the plurality of third electrodes being in contact with the gate insulating layer,
wherein the plurality of third electrodes are electrically connected to one of the first electrode and the second electrode;
wherein one of the first electrode and the second electrode, which is electrically connected to the plurality of third electrodes, has a work function $\phi md$, the other of the first electrode and the second electrode, which is not electrically connected to the plurality of third electrodes, has a work function $\phi ms$, and the oxide semiconductor layer has an electron affinity $\chi$,
wherein the work function $\phi md$, the work function $\phi ms$ and the electron affinity $\chi$ satisfy $\phi ms \leq \chi < \phi md$, and
wherein a first area of contact between the oxide semiconductor layer and the one of the first electrode and the second electrode is different from a second area of contact between the oxide semiconductor layer and the other of the first electrode and the second electrode.

10. The non-linear element according to claim 9,
wherein the first area is larger than the second area.

11. The non-linear element according to claim 9,
wherein the first area is less than the second area.

12. The non-linear element according to claim 9,
wherein carrier density of the oxide semiconductor layer is lower than $1 \times 10^{12}/cm^3$.

13. The non-linear element according to claim 9,
wherein at least a portion of the gate insulating layer which is contact with the oxide semiconductor layer comprises an oxide insulating layer.

14. The non-linear element according to claim 9, further comprising a nitride insulating layer on and in contact with the gate insulating layer.

15. The non-linear element according to claim 9,
wherein the one of the first electrode and the second electrode, which has the work function φmd, comprises an element selected from the group consisting of tungsten, molybdenum, chromium, iron, gold, platinum, copper, cobalt, nickel, beryllium, and indium tin oxide.

16. The non-linear element according to claim 9,
wherein the other of the first electrode and the second electrode, which has the work function φms, comprises an element selected from the group consisting of titanium, yttrium, aluminum, zirconium, magnesium, silver, manganese, and tantalum.

17. The non-linear element according to claim 9,
wherein a material of the first electrode is different from a material of the second electrode.

18. A display device comprising a protection circuit including the non-linear element according to claim 9.

19. An electronic device comprising the display device according to claim 18.

20. The non-linear element according to claim 9,
wherein the first electrode is formed over a substrate;
wherein the plurality of third electrodes are electrically connected to the first electrode,
wherein the first electrode has the work function φmd,
wherein the second electrode has the work function φms, and
wherein an area of contact between the first electrode and the oxide semiconductor layer is larger than an area of contact between the second electrode and the oxide semiconductor layer.

21. The non-linear element according to claim 9,
wherein the oxide semiconductor layer comprises hydrogen at a concentration of $5 \times 10^{19}/cm^3$ or less.

22. The non-linear element according to claim 21, wherein the concentration of hydrogen in the oxide semiconductor layer is detected by secondary ion mass spectrometry.

23. A non-linear element comprising:
a first electrode;
an oxide semiconductor layer on and in contact with the first electrode;
a second electrode on and in contact with the oxide semiconductor layer;
a gate insulating layer over the first electrode, the oxide semiconductor layer, and the second electrode; and
a third electrode adjacent to the oxide semiconductor layer with the gate insulating layer interposed therebetween, the third electrode being in contact with the gate insulating layer,
wherein the third electrode is connected to one of the first electrode and the second electrode; and
wherein a first area of contact between the oxide semiconductor layer and the one of the first electrode and the second electrode is different from a second area of contact between the oxide semiconductor layer and the other of the first electrode and the second electrode.

24. The non-linear element according to claim 23,
wherein the first area is larger than the second area.

25. The non-linear element according to claim 23,
wherein the first area is less than the second area.

26. The non-linear element according to claim 23,
wherein carrier density of the oxide semiconductor layer is lower than $1 \times 10^{12}/cm^3$.

27. The non-linear element according to claim 23,
wherein at least a portion of the gate insulating layer which is contact with the oxide semiconductor layer comprises an oxide insulating layer.

28. The non-linear element according to claim 23, further comprising a nitride insulating layer on and in contact with the gate insulating layer.

29. The non-linear element according to claim 23,
wherein the one of the first electrode and the second electrode, which has a work function φmd, comprises an element selected from the group consisting of tungsten, molybdenum, chromium, iron, gold, platinum, copper, cobalt, nickel, beryllium, and indium tin oxide.

30. The non-linear element according to claim 23,
wherein the other of the first electrode and the second electrode, which has a work function φms, comprises an element selected from the group consisting of titanium, yttrium, aluminum, zirconium, magnesium, silver, manganese, and tantalum.

31. The non-linear element according to claim 23,
wherein a material of the first electrode is different from a material of the second electrode.

32. A display device comprising a protection circuit including the non-linear element according to claim 23.

33. An electronic device comprising the display device according to claim 32.

* * * * *

UNITED STATES PATENT AND TRADEMARK OFFICE
CERTIFICATE OF CORRECTION

PATENT NO. : 8,390,044 B2
APPLICATION NO. : 12/954338
DATED : March 5, 2013
INVENTOR(S) : Daisuke Kawae, Hideki Uochi and Shunpei Yamazaki It is certified that error appears in the above-identified patent and that said Letters Patent is hereby corrected as shown below:

In the Specification:

Column 6, line 7, after "layer" replace "III" with --111--;

Column 9, line 3, replace "$1 \times 10^{-7}/cm^3$" with --$1 \times 10^{11}/cm^3$--; and Column 20, line 13, replace "100 μm" with --100nm--.

Signed and Sealed this
Sixth Day of August, 2013

Teresa Stanek Rea
*Acting Director of the United States Patent and Trademark Office*